US009853252B2

(12) United States Patent
Kobayashi et al.

(10) Patent No.: US 9,853,252 B2
(45) Date of Patent: Dec. 26, 2017

(54) LIGHT-EMITTING DEVICE, ELECTRONIC EQUIPMENT, AND PROCESS OF PRODUCING LIGHT-EMITTING DEVICE

(71) Applicant: SEIKO EPSON CORPORATION, Tokyo (JP)

(72) Inventors: Hidekazu Kobayashi, Azumino (JP); Koya Shiratori, Matsumoto (JP); Atsushi Yoshioka, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/413,859

(22) Filed: Jan. 24, 2017

(65) Prior Publication Data

US 2017/0149021 A1 May 25, 2017

Related U.S. Application Data

(60) Continuation of application No. 15/085,313, filed on Mar. 30, 2016, now Pat. No. 9,590,204, which is a (Continued)

(30) Foreign Application Priority Data

Aug. 28, 2008 (JP) .................................. 2008-219266
Nov. 14, 2008 (JP) .................................. 2008-291997
(Continued)

(51) Int. Cl.
*H01L 51/56* (2006.01)
*H01L 51/52* (2006.01)
(Continued)

(52) U.S. Cl.
CPC .......... *H01L 51/56* (2013.01); *H01L 51/0021* (2013.01); *H01L 51/5092* (2013.01); *H01L 51/5203* (2013.01); *H01L 51/5271* (2013.01)

(58) Field of Classification Search
CPC . H01L 51/56; H01L 51/5271; H01L 51/0021; H01L 51/5092; H01L 51/5203
See application file for complete search history.

(56) References Cited

U.S. PATENT DOCUMENTS 4,885,211 A 12/1989 Tang et al.
7,126,269 B2 10/2006 Yamada
(Continued)

FOREIGN PATENT DOCUMENTS

JP 2723242 B2 3/1998
JP 2003-109775 A 4/2003
(Continued)

OTHER PUBLICATIONS

Apr. 12, 2012 Office Action issued in U.S. Appl. No. 12/547,070.
Aug. 27, 2012 Office Action issued in U.S. Appl. No. 12/547,070.

*Primary Examiner* — Kyoung Lee
(74) *Attorney, Agent, or Firm* — Oliff PLC

(57) ABSTRACT

A light-emitting device includes a light-reflecting layer, a first electrode disposed on or above the light-reflecting layer, a semi-transparent reflective second electrode, a light-emitting function layer disposed between the first electrode and the second electrode, and an electron-injection layer disposed between the light-emitting function layer and the second electrode. The second electrode is made of an Ag alloy having an Ag content of from 50% by atoms to 98% by atoms.

3 Claims, 29 Drawing Sheets

Related U.S. Application Data division of application No. 12/547,070, filed on Aug. 25, 2009, now abandoned.

(30) Foreign Application Priority Data

| Nov. 14, 2008 | (JP) | ................................. | 2008-291998 |
| Jul. 3, 2009 | (JP) | ................................. | 2009-158522 |

(51) Int. Cl.
  *H01L 51/50* (2006.01)
  *H01L 51/00* (2006.01)

(56) References Cited

U.S. PATENT DOCUMENTS

| 7,622,865 | B2 | 11/2009 | Kobayashi |
| 7,994,704 | B2 | 8/2011 | Kobayashi |
| 8,164,258 | B2 | 4/2012 | Hayashi et al. |
| 2004/0115859 | A1 | 6/2004 | Murayama et al. |
| 2005/0035710 | A1* | 2/2005 | Tanase ................ H01L 51/5234 313/506 |
| 2005/0099113 | A1 | 5/2005 | Yamada |
| 2005/0285114 | A1* | 12/2005 | Kang ................... H01L 51/5203 257/72 |
| 2009/0039769 | A1 | 2/2009 | Matsunami et al. |
| 2009/0079336 | A1 | 3/2009 | Yamada et al. |
| 2009/0102358 | A1 | 4/2009 | Shimoji et al. |

FOREIGN PATENT DOCUMENTS

| JP | 2004-139930 A | 5/2004 |
| JP | 2006-332019 A | 12/2006 |
| JP | 2007-012410 A | 1/2007 |
| JP | 2007-157606 A | 6/2007 |
| JP | 2007-335347 A | 12/2007 |
| JP | 2008-130687 A | 6/2008 |
| JP | 2008-177145 A | 7/2008 |
| WO | 2006/008942 A1 | 1/2006 |

* cited by examiner

FIG. 2

|  | RESISTIVITY [×10⁻⁸ Ω·m] | VOLTAGE [V] | CURRENT EFFICIENCY [cd/A] | POWER EFFICIENCY [lm/W] |
|---|---|---|---|---|
| Mg:Ag=10:1 | 88.8 | 7.9 | 4.9 | 1.9 |
| Mg:Ag=2:1 | 30.2 | 7.8 | 3.7 | 1.5 |
| Mg:Ag=1:1 | 30.6 | 7.2 | 4.4 | 1.9 |
| Mg:Ag=1:3 | 20.5 | 7.0 | 7.2 | 3.2 |
| Mg:Ag=1:9 | 12.9 | 6.9 | 8.6 | 3.9 |
| Mg:Ag=1:20 | 7.74 | 6.8 | 10 | 4.6 |
| Mg:Ag=1:50 | 8.1 | 7.2 | 8.9 | 3.9 |
| Mg:Ag=0:100 | ∞ | - | - | - |

FIG. 3

|  | SURFACE ROUGHNESS (Ra) [nm] | ROOT MEAN SQUARE (RMS) ROUGHNESS [nm] |
|---|---|---|
| Mg:Ag=10:1 | 1.03 | 1.45 |
| Mg:Ag=3:1 | 0.43 | 0.58 |
| Mg:Ag=1:1 | 1.41 | 1.85 |
| Mg:Ag=1:3 | 0.436 | 0.546 |
| Mg:Ag=1:10 | 0.5 | 0.67 |
| Mg:Ag=0:10 | 2.09 | 2.64 |

FIG. 9A STEP P1
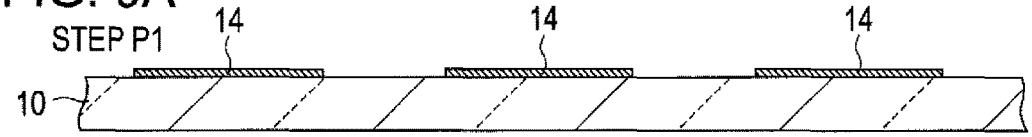
FIG. 9B STEP P2
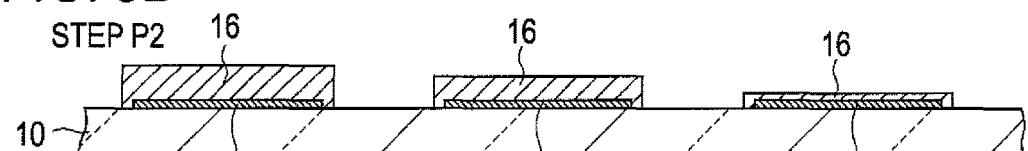
FIG. 9C STEP P3
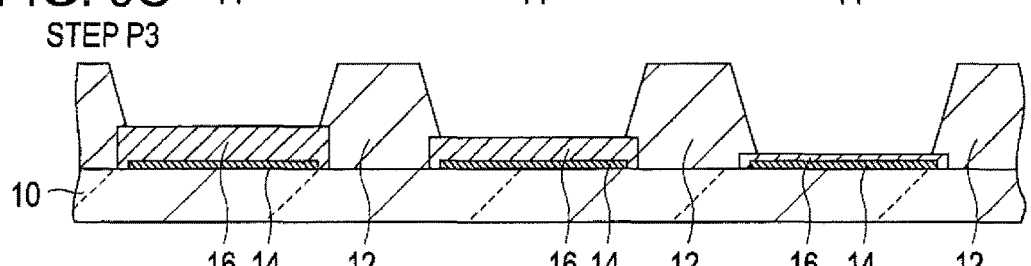
FIG. 9D STEP P4
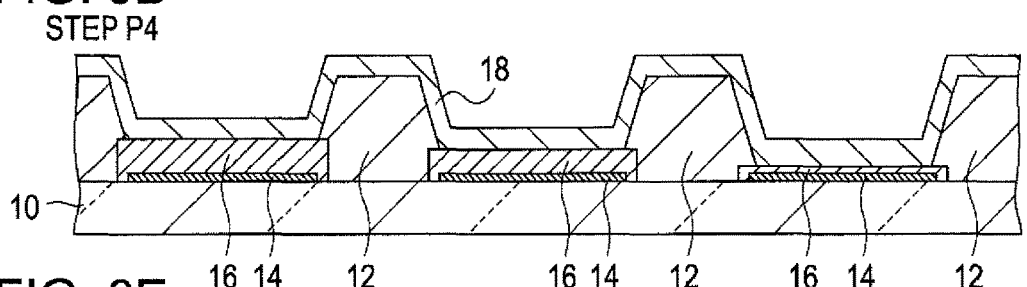
FIG. 9E STEP P5
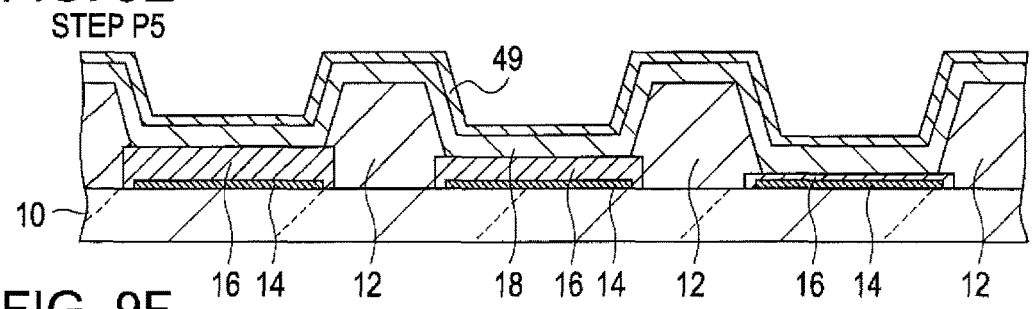
FIG. 9F STEP P6
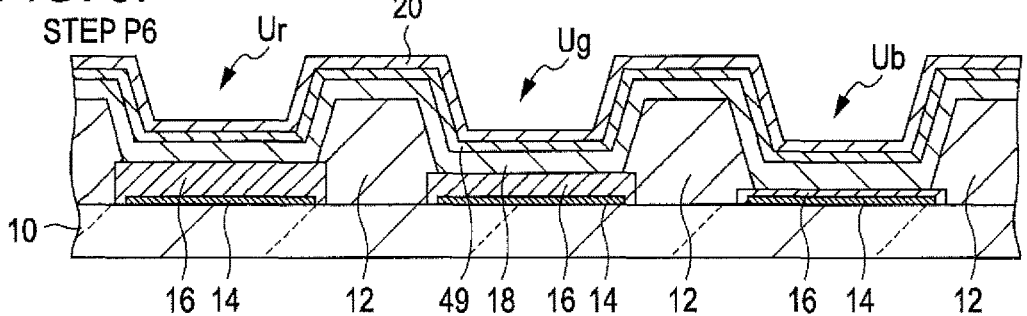

STEP P7

STEP P8

FIG. 11

|  | SHEET RESISTANCE [Ω/□] | VOLTAGE [V] | CURRENT EFFICIENCY [cd/A] | POWER EFFICIENCY [lm/W] |
|---|---|---|---|---|
| FILM THICKNESS = 10 nm | 12.9 | 6.9 | 8.4 | 3.7 |
| FILM THICKNESS = 13 nm | 9.9 | 6.9 | 8.5 | 3.8 |
| FILM THICKNESS = 16 nm | 8.1 | 6.9 | 8.6 | 3.9 |

FIG. 16

| SAMPLE CONFIGURATION | RESISTANCE VALUE |
|---|---|
| MgAg(1:9, 13 nm) + PASSIVATION LAYER | 9.86 MΩ |
| MgAg(1:9, 13 nm)/LiF(10 nm) + PASSIVATION LAYER | 4.3 Ω |
| MgAg(1:9, 13 nm)/LiF(25 nm) + PASSIVATION LAYER | 4.4 Ω |
| MgAg(1:9, 13 nm)/LiF(50 nm) + PASSIVATION LAYER | 5.0 Ω |

FIG. 17

| SAMPLE CONFIGURATION | RESISTANCE VALUE |
|---|---|
| MgAg(1:9, 13 nm)/$CaF_2$(10 nm) + PASSIVATION LAYER | 4.5 Ω |
| MgAg(1:9, 13 nm)/$CaF_2$(25 nm) + PASSIVATION LAYER | 4.8 Ω |
| MgAg(1:9, 13 nm)/$CaF_2$(50 nm) + PASSIVATION LAYER | 5.5 Ω |

FIG. 18

| SAMPLE CONFIGURATION | RESISTANCE VALUE |
|---|---|
| MgAg(1:9, 13 nm)/Li$_2$O(10 nm)+PASSIVATION LAYER | 4.2 Ω |
| MgAg(1:9, 13 nm)/Li$_2$O(25 nm)+PASSIVATION LAYER | 5.2 Ω |
| MgAg(1:9, 13 nm)/Li$_2$O(50 nm)+PASSIVATION LAYER | 5.1 Ω |

FIG. 19

| SAMPLE CONFIGURATION | RESISTANCE VALUE |
|---|---|
| MgAg(1:9, 13 nm)/MgF$_2$(10 nm)+PASSIVATION LAYER | 4.8 Ω |
| MgAg(1:9, 13 nm)/MgF$_2$(25 nm)+PASSIVATION LAYER | 5.3 Ω |
| MgAg(1:9, 13 nm)/MgF$_2$(50 nm)+PASSIVATION LAYER | 5.3 Ω |

STEP P6

STEP P7

STEP P8

LIGHT-EMITTING DEVICE, ELECTRONIC EQUIPMENT, AND PROCESS OF PRODUCING LIGHT-EMITTING DEVICE

This is a Continuation of application Ser. No. 15/085,313 filed Mar. 30, 2016, which is a Divisional of application Ser. No. 12/547,070 filed Aug. 25, 2009 (now abandoned), which claims the benefit of Japanese Application No. 2008-219266 filed Aug. 28, 2008, Japanese Application No. 2008-291997 filed Nov. 14, 2008, Japanese Application No. 2008-291998 filed Nov. 14, 2008, and Japanese Application No. 2009-158522 filed Jul. 3, 2009. The disclosure of the prior applications is hereby incorporated by reference herein in its entirety.

BACKGROUND

1. Technical Field

The present invention relates to a light-emitting device, electronic equipment, and a process of producing the light-emitting device.

2. Related Art

Recently, various types of light-emitting devices having light-emitting elements such as organic EL (electroluminescent) elements or organic light-emitting diodes (hereinafter, referred to as "OLEDs") called light-emitting polymer elements are proposed. The light-emitting elements included in such light-emitting devices usually have a structure in which a light-emitting layer made of an organic EL material is disposed between two electrodes.

For example, Japanese Patent No. 2723242 (Patent Document 1) discloses a light-emitting element composed of an anode, an organic light-emitting medium disposed on the anode, and a cathode disposed on the organic light-emitting medium. In Patent Document 1, a portion of the organic light-emitting medium in contact with the anode functions as a hole-transporting region, and, at the same time, a portion of the organic light-emitting medium in contact with the cathode functions as an electron-transporting region. In addition, in Patent Document 1, the cathode is made of MgAg (magnesium-silver alloy) having a composition of Mg:Ag=10:1.

In a case of a (top emission) configuration in which an anode is disposed on a substrate, an organic light-emitting medium is disposed on the anode, a cathode is disposed on the organic light-emitting medium, and light emitted by the organic light-emitting medium is extracted from the cathode side on the opposite side of the substrate, the cathode is required to have high transparency and therefore is desirable to have a thickness as thin as possible. However, since resistance value is inversely proportional to thickness, the resistance value of the cathode in the configuration disclosed in Patent Document 1 becomes significantly high by reducing the thickness. Therefore, the reduction in the thickness causes a problem that the electrical conductivity of the light-emitting element is decreased.

The electrical conductivity of the cathode can be enhanced by increasing the ratio of Ag in the MgAg forming the cathode. However, in such a case, there is a possibility that asperities are generated by aggregation of the Ag atoms, and if a layer for absorbing the effect of such asperities is additionally formed, there is a possibility of a change in the light-emitting characteristics.

SUMMARY

An advantage of some aspects of the invention is to provide a cathode having both a high electrical conductivity and a high transparency and a light-emitting device including the cathode, wherein various problems that the light-emitting device may have by forming such a cathode are solved.

The invention can be realized as the following aspects or application examples.

In accordance with a first application example of the invention, a light-emitting device includes a light-reflecting layer, a first electrode disposed on or above the light-reflecting layer, a semi-transparent reflective second electrode, a light-emitting function layer disposed between the first electrode and the second electrode, and an electron-injection layer disposed between the light-emitting function layer and the second electrode. The second electrode is made of an Ag alloy having an Ag content of from 50% by atoms to 98% by atoms.

In such a configuration, the electron injection property of the electron-injection layer can be increased to enhance the light emission efficiency. Therefore, the display quality of the light-emitting device can be increased.

In accordance with a second application example of the invention, the light-emitting device is preferably designed such that the second electrode has a resistivity of $31 \times 10^{-8} \Omega \cdot m$ or less.

Such a configuration can prevent degradation in electrical conductivity of a light-emitting element. Therefore, the display quality of the light-emitting device can be increased.

In accordance with a third application example of the invention, the second electrode of the light-emitting device is preferably made of an alloy of a metal of Mg, Cu, Zn, Pd, Nd, or Al and Ag and is more preferably made of MgAg.

In accordance with a fourth application example of the invention, the electron-injection layer of the light-emitting device is preferably made of LiF, $Li_2O$, Liq, MgO, or $CaF_2$ and is more preferably made of LiF. Here, since the electron-injection layer is made of an insulating material, the applied voltage (driving voltage) necessary for allowing the light-emitting element to emit light is increased with the thickness of the electron-injection layer. Accordingly, the thickness of the electron-injection layer is controlled to preferably 0.5 to 2 nm for inhibiting the increase in the driving voltage value.

In accordance with a fifth application example of the invention, a process of producing the light-emitting device includes forming a light-reflecting layer on a substrate, forming a first electrode on the light-reflecting layer, forming a light-emitting function layer on the first electrode, forming an electron-injection layer on the light-emitting function layer, and forming a second electrode on the electron-injection layer. The step of forming the second electrode on the electron-injection layer is preferably performed by co-depositing a metal of Mg, Cu, Zn, Pd, Nd, or Al and Ag on the electron-injection layer at a deposition rate ratio within a range of 2:1 to 1:50.

In such a producing process, the resistivity of the second electrode can be suppressed to $31 \times 10^{-8} \Omega \cdot m$ or less. Therefore, in the resulting light-emitting device, degradation in the electrical conductivity of the light-emitting element can be inhibited.

In accordance with a sixth application example of the invention, a light-emitting device includes a light-reflecting layer, a transparent first electrode disposed on or above the light-reflecting layer, a semi-transparent reflective second electrode, a light-emitting function layer disposed between the first electrode and the second electrode, an electron-injection layer disposed between the light-emitting function layer and the second electrode, a first layer disposed on the second electrode for absorbing stress to the second electrode, and a second layer made of an inorganic material disposed on the first layer. The second electrode is made of an alloy in which any of Mg, Cu, Zn, Pd, Nd, and Al is mixed with Ag at an atomic number ratio in the range of 1:3 to 1:50.

In the light-emitting device having such a configuration, the second electrode can be prevented from being broken by the stress or the like during the formation of the second layer, while a decrease in contrast during black display is inhibited. Consequently, the decrease in the electrical conductivity of the light-emitting element can be inhibited.

In accordance with a seventh application example of the invention, the second electrode of the light-emitting device preferably has a thickness in a range of 10 to 30 nm.

A thickness of the second electrode smaller than 10 nm causes an increase in the resistance value of the second electrode, resulting in insufficient electrical conductivity. A thickness larger than 30 nm results in insufficient transparency of the second electrode.

In accordance with an eighth application example of the invention, the first layer of the light-emitting device is preferably made of a material having a work function of 4.2 eV or more and being other than Ag. Specifically, the first layer may be made of Zn, Al, Au, $SnO_2$, $ZnO_2$, or SiO.

By forming the first layer with such a material, a decrease in contrast during black display is sufficiently inhibited to increase the display quality of the light-emitting device. In addition, examples of the "material other than Ag" are not limited to metals and include dielectrics.

In accordance with a ninth application example of the invention, the light-emitting function layer of the light-emitting device preferably includes an electron-injection layer that is made of the same material as that of the first layer. In this configuration, the first layer may be made of LiF, $Li_2O$, Liq, MgO, $MgF_2$, $CaF_2$, $SrF_2$, NaF, or WF.

In accordance with a tenth application example of the invention, a light-emitting device includes a light-reflecting layer, a transparent first electrode disposed on or above the light-reflecting layer, a semi-transparent reflective second electrode, a light-emitting function layer disposed between the first electrode and the second electrode, an electron-injection layer disposed between the light-emitting function layer and the second electrode, a reduction layer disposed between the electron-injection layer and the second electrode and made of a reducible metal material for reducing the electron-injecting material forming the electron-injection layer, a first layer disposed on the second electrode and absorbing stress to the second electrode, and a second layer of an inorganic material disposed on the first layer. The second electrode is made of only Ag.

In such a configuration, the Ag atoms can be prevented from aggregating into islands by using the reduction layer of a reducible metal material as a base of the second electrode. Therefore, the second electrode can be a continuous film. In addition, since the second electrode is covered by the first layer having a stress-absorbing ability and the second layer is disposed on the first layer, the second electrode can be prevented from being broken by stress.

In accordance with an eleventh application example of the invention, a light-emitting device includes a light-reflecting layer, a transparent first electrode disposed on or above the light-reflecting layer, a semi-transparent reflective second electrode, a light-emitting function layer disposed between the first electrode and the second electrode, a mixture layer disposed between the light-emitting function layer and the second electrode and made of a mixture of an electron-injecting material and a reducible metal material for reducing the electron-injecting material, a first layer disposed on the second electrode and absorbing stress to the second electrode, and a second layer of an inorganic material disposed on the first layer. The second electrode is made of only Ag.

In such a configuration, the Ag atoms can be prevented from aggregating into islands by using the mixture layer made of a mixture of an electron-injecting material and a reducible metal material for reducing the electron-injecting material as a base of the second electrode. Therefore, the second electrode can be a continuous film. In addition, since the second electrode is covered by the first layer having a stress-absorbing ability and the second layer is disposed on the first layer, the second electrode can be prevented from being broken by stress.

In accordance with a twelfth application example of the invention, the first layer of the light-emitting device is preferably made of an electron-injecting material. In this configuration, the first layer is preferably made of LiF, $Li_2O$, Liq, MgO, $CaF_2$, $SrF_2$, NaF, or WF. In more preferable example, the first layer is made of LiF, and the reducible metal material is Al.

In accordance with a thirteenth application example of the invention, a light-emitting device includes a plurality of light-emitting elements each including a first electrode, a second electrode, and a light-emitting layer disposed between the first electrode and the second electrode; a wall separating the plurality of light-emitting elements; a first layer partially covering the second electrodes and easing the concentration of stress to the second electrodes; and a second layer of an inorganic material disposed on the first layer. The second electrode covers the light-emitting layer in each of the plurality of light-emitting elements and the wall separating the plurality of light-emitting elements.

In such a configuration, since the first layer having a stress-absorbing ability for easing the concentration of stress to the second electrode partially covers the second electrode, the second electrode can be prevented from being broken by the concentration of stress, compared to a configuration in which only a second layer having a passivation ability, without a first layer, is disposed on a second electrode. Therefore, a decrease in electrical conductivity of the light-emitting element can be inhibited. Furthermore, the second electrode may cover all the light-emitting elements and the wall on a substrate or may cover a plurality, but not all, of the light-emitting elements and the wall separating the plurality of light-emitting elements on a substrate.

In accordance with a fourteenth application example of the invention, the first layer of the light-emitting device preferably has openings at positions corresponding to the light-emitting elements.

In such a configuration, light emitted from the light-emitting layer can be extracted to the exterior from a region not being covered by the first layer on the second electrode. Therefore, the amount of light emitted from the light-emitting device toward the exterior can be increased, compared to a configuration in which the entire (whole area of) second electrode is covered by a first layer.

In accordance with a fifteenth application example of the invention, the light-emitting device is preferably configured in such a manner that the first layer is not provided at at least part of a region where the wall and the second electrode overlap each other, and an auxiliary electrode is disposed at at least part of the region where the first layer is not provided.

In such a configuration, the light-emitting device can be produced by a process including (1) depositing a second electrode on a light-emitting layer in each light-emitting element and a wall, inside a deposition chamber, (2) subsequently, inside the deposition chamber, depositing a first layer on the second electrode at a region where the second electrode overlaps the light-emitting layer in the zone of each light-emitting element separated by the wall, and (3) taking out the substrate from the deposition chamber and then forming an auxiliary electrode on the second electrode at a region where the second electrode overlaps the wall. That is, the second electrode and the first layer can be formed by a continuous deposition process. Consequently, manufacturing time and cost can be reduced, compared to a configuration in which the second electrode and the auxiliary electrode are covered by a first layer.

In accordance with a sixteenth application example, the light-emitting device according to the invention can be utilized in various types of electronic equipment. Typical examples of the electronic equipment are those utilizing the light-emitting device as a display, such as personal computers and mobile phones.

BRIEF DESCRIPTION OF THE DRAWINGS

The invention will be described with reference to the accompanying drawings, wherein like numbers reference like elements.

FIG. 2 is a diagram showing relationships between deposition rate ratios of Mg and Ag for forming an opposite electrode of an light-emitting element according to the first embodiment and resistivities and other factors of the opposite electrode.

FIG. 3 is a diagram showing a relationship between deposition rate ratios of Mg and Ag for forming the opposite electrode of the light-emitting element according to the first embodiment and surface roughnesses of the opposite electrode.

FIG. 9A is a cross-sectional view showing a step of a process for producing the light-emitting device according to the first embodiment.

FIG. 9B is a cross-sectional view showing a step of the process for producing the light-emitting device according to the first embodiment.

FIG. 9C is a cross-sectional view showing a step of the process for producing the light-emitting device according to the first embodiment.

FIG. 9D is a cross-sectional view showing a step of the process for producing the light-emitting device according to the first embodiment.

FIG. 9E is a cross-sectional view showing a step of the process for producing the light-emitting device according to the first embodiment.

FIG. 9F is a cross-sectional view showing a step of the process for producing the light-emitting device according to the first embodiment.

FIG. 11 is a diagram showing relationships between the thickness of an opposite electrode of a light-emitting element according to a second embodiment and voltage, current efficiency, and power efficiency.

FIG. 16 is a diagram showing resistance values measured when a passivation layer is formed directly on a sample and when a stress-absorbing layer made of LiF is disposed between a passivation layer and a sample.

FIG. 17 is a diagrams showing measurement results when the stress-absorbing layer is made of $CaF_2$.

FIG. 18 is a diagrams showing measurement results when the stress-absorbing layer is made of $Li_2O$.

FIG. 19 is a diagrams showing measurement results when the stress-absorbing layer is made of $MgF_2$.

DESCRIPTION OF EXEMPLARY EMBODIMENTS

Various embodiments according to the invention will now be described with reference to the accompanying drawings. In the following drawings, the scale of each of the layers and the portions differs from the actual scale for enabling to visually recognize the layers and the portions on the drawings.

A: First Embodiment

A-1: Structure of Light-Emitting Device

Figure 1:
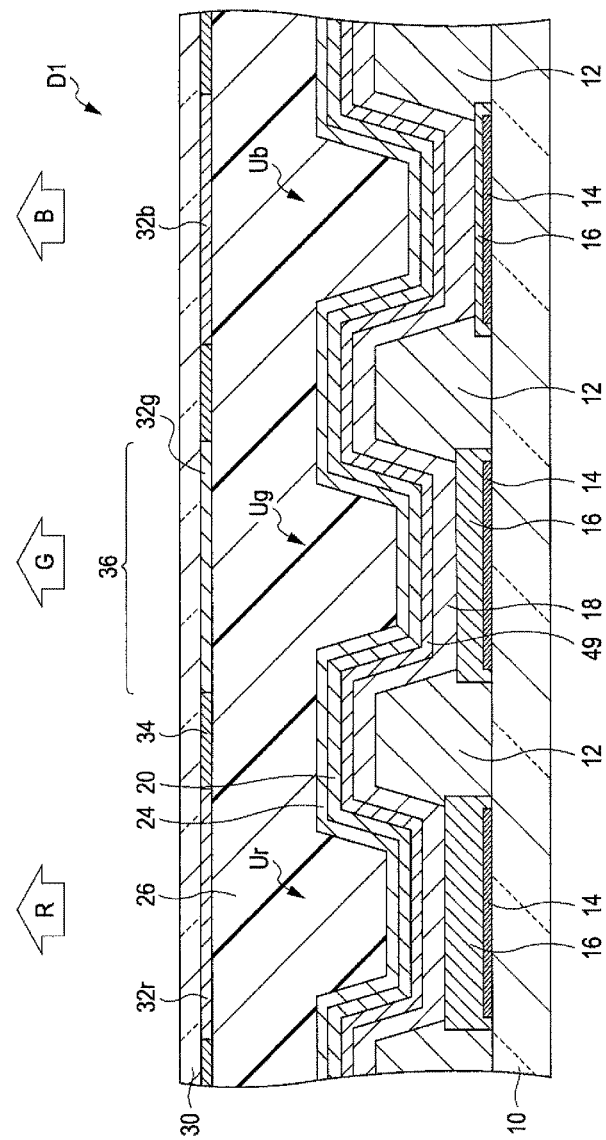
FIG. 1 is a cross-sectional view illustrating a structure of a light-emitting device according to a first embodiment.

FIG. 1 is a cross-sectional view illustrating a structure of a light-emitting device D1 according to a first embodiment of the invention. As shown in FIG. 1, the light-emitting device D1 is configured such that a plurality of light-emitting elements U (Ur, Ug, and Ub) is arrayed on a surface of a first substrate 10. Each of the light-emitting elements U is an element generating light with a wavelength corresponding to any of a plurality of colors (red, green, and blue). In these elements, a single light-emitting function layer is common to the plurality of elements, and emission light with a wavelength corresponding to the respective light-emitting elements is extracted by controlling the optical length between the below-described reflecting layer and semi-reflective opposite electrode in each light-emitting element for optimizing resonance. In the first embodiment, by the resonance effect, the light-emitting element Ur emits red light, the light-emitting element Ug emits green light, and the light-emitting element Ub emits blue light. The light-emitting device D1 according to the first embodiment is a top emission type in which light generated by each light-emitting element U is emitted toward the opposite side with respect to the first substrate 10. Therefore, the first substrate 10 may be made of an opaque plate-like material such as a ceramic or metal sheet, as well as a light-transmissive plate-like material such as glass.

The first substrate 10 is provided with wiring (not shown) for feeding power to the light-emitting elements U to emit light. Furthermore, the first substrate 10 is provided with circuits (not shown) for feeding power to the light-emitting elements U.

As shown in FIG. 1, a wall 12 (separator) is formed on the first substrate 10. The wall 12 separates the space on a surface of the first substrate 10 for each light-emitting element U and is made of a transparent insulative material such as acryl or polyimide.

Each of the plurality of light-emitting elements U includes a light-reflecting layer 14, a pixel electrode 16 as the first electrode, a light-emitting function layer 18, an electron-injection layer 49, and an opposite electrode 20 as the second electrode. As shown in FIG. 1, a plurality of light-reflecting layers 14 is formed on the first substrate 10. The light-reflecting layers 14 are arranged so as to correspond to the respective light-emitting elements U. The light-reflecting layers 14 are made of a light-reflective material. Preferred examples of such a material include simple metals such as aluminum and silver and alloys whose main components are aluminum or silver. In the first embodiment, the light-reflecting layer 14 is made of a silver alloy available from Furuya Metal Co., Ltd. under the trade name "APC" and has a thickness of 80 nm.

The pixel electrodes 16 shown in FIG. 1 are anodes and are disposed on the respective light-reflecting layers 14 and surrounded by the wall 12. The pixel electrodes 16 are made of a transparent, electrically conductive oxide material, such as ITO (indium tin oxide), IZO (indium zinc oxide, a registered trade name of Idemitsu Kosan Co., Ltd.), or $ZnO_2$. In the first embodiment, the pixel electrodes 16 are made of ITO and have different thicknesses that correspond to the respective emission colors of the light-emitting elements U. The details thereof will be described below. Alternatively, the pixel electrodes 16 made of, for example, ITO in the light-emitting elements may have the same thickness. In such a case, the optical lengths corresponding to the respective light-emitting elements can be obtained by disposing a transparent layer made of, for example, SiN (silicon nitride) or SiO (silicon oxide), and having different thicknesses between the light-reflecting layer 14 and the pixel electrode 16 made of ITO. Furthermore, a layer that can function as both the light-reflecting layer 14 and the pixel electrode 16 may be used. For example, Ag has a high work function and can inject holes to a hole-injection layer. In this case, the control of the optical length in each light-emitting element for optimizing the resonance is performed by the light-emitting function layer 18.

As shown in FIG. 1, the light-emitting function layer 18 is formed so as to cover each of the pixel electrodes 16 and the wall 12. That is, the light-emitting function layer 18 continues over the plurality of light-emitting elements U, and the characteristics of the light-emitting function layer 18 are equally applied to the plurality of light-emitting elements U. Though the details are not shown in the drawing, the light-emitting function layer 18 is composed of a hole-injection layer disposed on the pixel electrodes 16, a hole-transporting layer disposed on the hole-injection layer, a light-emitting layer disposed on the hole-transporting layer, and an electron-transporting layer disposed on the light-emitting layer.

In the first embodiment, the hole-injection layer is made of "HI-406", the trade name of Idemitsu Kosan Co., Ltd., and has a 40 nm thickness; and the hole-transporting layer is made of "HT-320", the trade name of Idemitsu Kosan Co., Ltd., and has a 15 nm thickness. The hole-injection layer and the hole-transporting layer may be formed of a single layer having both functions of the hole-injection layer and the hole-transporting layer. In addition, as long as the same functions can be achieved, other material can be similarly used.

The light-emitting layer is made of an organic EL material that emits light by recombining holes and electrons. In the first embodiment, the organic EL material is a low molecular material and emits white light. The host material of the light-emitting layer is "BH-232", the trade name of Idemitsu Kosan Co., Ltd., and red, green, and blue dopants are mixed with the host material. In the first embodiment, "RD-001", "GD-206", and "BD-102", the trade names of Idemitsu Kosan Co., Ltd., are used as the red, green, and blue dopants, respectively. In the first embodiment, the thickness of the light-emitting layer is 65 nm. In addition, as long as the same functions can be achieved, other materials can be similarly used.

In the first embodiment, the electron-transporting layer is made of Alq3 (tris(8-quinolinolato)aluminum complex) and has a 10 nm thickness. In addition, as long as the same function can be achieved, other materials can be similarly used.

The electron-injection layer 49 shown in FIG. 1 enhances the efficiency of electron injection to the light-emitting function layer 18 and is formed so as to cover the light-emitting function layer 18. That is, the electron-injection layer 49 continues over the plurality of light-emitting elements U. In order to enhance the efficiency of electron injection to the light-emitting function layer 18, it is desirable that the potential barrier between the opposite electrode 20 as the cathode and the light-emitting function layer 18 is low. Therefore, the material for the electron-injection layer 49 is preferably a metal compound, such as a halide (in particular, fluoride) or an oxide, or a quinolinol complex of an alkali metal or an alkaline-earth metal, such as LiF, Li$_2$O, Liq, MgO, or CaF$_2$. In the first embodiment, the electron-injection layer 49 is made of LiF (lithium fluoride).

In addition, since the electron-injection layer 49 is formed of an insulating material, a larger thickness causes higher driving voltage of the light-emitting elements U. In order to prevent an increase in the driving voltage value of the light-emitting elements U, the thickness of the electron-injection layer 49 is preferably within the range of 0.5 to 2 nm. In the first embodiment, the thickness of the electron-injection layer 49 is set to 1 nm. However, since a quinolinol complex has an electron-transporting property, the electron-injection layer 49 made of a quinolinol complex can also function as an electron-transporting layer and therefore have a thickness of up to about 40 nm.

The opposite electrode 20 shown in FIG. 1 is a cathode and is formed so as to cover the electron-injection layer 49. That is, the opposite electrode 20 continues over the plurality of light-emitting elements U. The opposite electrode 20 functions as a semi-transparent reflective layer having a property that part of light reaching the surface thereof is transmitted and the remaining light is reflected (i.e., semi-transparent reflectivity) and is formed of an alloy of a metal of Mg, Cu, Zn, Pd, Nd, or Al and Ag. In the first embodiment, the opposite electrode 20 is made of MgAg (magnesium-silver alloy). As described below, in the first embodiment, the opposite electrode 20 is formed by co-depositing Mg and Ag on the electron-injection layer 49.

In order to ensure the transparency of the opposite electrode 20, the thickness of the opposite electrode 20 is preferably 30 nm or less. However, if the opposite electrode 20 is too thin, the resistance thereof becomes high to make panel driving difficult. Accordingly, the thickness is preferably 10 nm or more. In the first embodiment, the thickness of the opposite electrode 20 is set to 16 nm.

The light-emitting function layer 18, the electron-injection layer 49, and the opposite electrode 20 are common to the plurality of light-emitting elements U. However, since the individual pixel electrodes 16 are separated from one another, when current flows between any of the pixel electrodes 16 and the opposite electrode 20, the light-emitting function layer 18 emits light only at a position where the light-emitting function layer 18 overlaps that pixel electrode 16. That is, the wall 12 separates the plurality of light-emitting elements U.

In the light-emitting device D1 according to the first embodiment, a resonator structure that resonates light emitted by the light-emitting function layer 18 is formed between the light-reflecting layer 14 and the opposite electrode 20. That is, light emitted by the light-emitting function layer 18 goes and returns between the light-reflecting layer 14 and the opposite electrode 20, and light with a specific wavelength is enhanced by resonance and passes through the opposite electrode 20 to travel toward the observer side (upside in FIG. 1) (top emission).

The thicknesses of the pixel electrodes 16 in the light-emitting elements U are controlled such that red color in the white light emitted by the light-emitting function layer 18 is enhanced in the light-emitting element Ur, green color is enhanced in the light-emitting element Ug, and blue color is enhanced in the light-emitting element Ub. More specifically, in the first embodiment, the pixel electrode 16 of the light-emitting element Ur has a 110 nm thickness, the pixel electrode 16 of the light-emitting element Ug has a 70 nm thickness, and the pixel electrode 16 of the light-emitting element Ub has a 30 nm thickness.

As shown in FIG. 1, a passivation layer 24 is disposed on the opposite electrode 20. The passivation layer 24 is a protection layer for preventing infiltration of water and the air into the light-emitting elements U and is formed as a second layer made of an inorganic material having a low gas transmittance, such as SiN (silicon nitride) or SiON (silicon oxynitride). In the first embodiment, the passivation layer 24 is made of SiON and has a 225 nm thickness.

As shown in FIG. 1, in the first embodiment, a second substrate 30 is disposed so as to face the plurality of light-emitting elements U provided on the first substrate 10. The second substrate 30 is made of a light transmissive material such as glass and is provided with color filters 32 and a light-shielding film 34 on the surface thereof facing the first substrate 10. The light-shielding film 34 is a film having a light-shielding property and is provided with openings 36 at positions corresponding to the respective light-emitting elements U. The color filters 32 are disposed in the openings 36.

In the first embodiment, a red color filter 32r that selectively transmits red light is disposed in the opening 36 corresponding to the light-emitting element Ur, a green color filter 32g that selectively transmits green light is disposed in the opening 36 corresponding to the light-emitting element Ug, and a blue color filter 32b that selectively transmits blue light is disposed in the opening 36 corresponding to the light-emitting element Ub.

The second substrate 30 provided with the color filters 32 and the light-shielding film 34 is bonded to the first substrate 10 via a sealing layer 26. The sealing layer 26 is made of a transparent resin material, for example, a hardening resin such as an epoxy resin.

FIG. 2 is a diagram showing the measurement results of various factors when the deposition rate ratio of Mg and Ag for forming the opposite electrode 20 of the light-emitting element Ug according to the first embodiment is 10:1, 2:1, 1:1, 1:3, 1:9, 1:20, 1:50, or 0:100. The resistance values shown in FIG. 2 are those of the opposite electrode 20. In addition, in FIG. 2, the values of voltage, current efficiency, and power efficiency are those when the density of current flowing in the opposite electrode 20 is 17.5 mA/cm². The voltage values shown in FIG. 2 are those applied between the pixel electrode 16 and the opposite electrode 20. In addition, the current efficiency shown in FIG. 2 is light-emission intensity per ampere of current in the light-emitting element Ug. The power efficiency shown in FIG. 2 is light-emission intensity per watt of power in the light emitting element Ug. The measurement results of various factors shown in FIG. 2 are only those of the light-emitting element Ug that emits green light, but other light-emitting elements Ur and Ub show similar results.

As shown in FIG. 2 (the thickness of the opposite electrode 20 is 16 nm), it is confirmed that the resistivity when the deposition rate ratio of Mg and Ag is 10:1 is significantly higher than those in other cases. The resistivity of the opposite electrode 20 is preferably $31\times10^8 \Omega\cdot m$ or less for preventing degradation in electrical conductivity of the light-emitting element. In the first embodiment, the lower limit of the deposition rate ratio of Mg and Ag (the deposition rate ratio of Mg and Ag when the ratio of deposition rate of Ag is a minimum) is 2:1. In addition, it is confirmed by XRF analysis of a deposition sample that the deposition rate ratio is approximately equal to the atomic number ratio.

Next, the upper limit of the deposition rate ratio of Mg and Ag (the deposition rate ratio of Mg and Ag when the ratio of deposition rate of Ag is a maximum) will be described. As shown in FIG. 2, since the resistivity is decreased with an increase in the ratio of the deposition rate of Ag, the ability of feeding power to the light-emitting elements is enhanced with an increase in the ratio of deposition rate of Ag, when the light-emitting elements are integrated to form a panel.

Here, it is supposed a case that the opposite electrode 20 is made of only Ag (the case that the deposition rate ratio of Mg and Ag is 0:100). Since Ag atoms are applied with force to bind to one another (aggregating force), if the thickness of the opposite electrode 20 made of only Ag is 30 nm or less, the Ag atoms aggregate one another into islands to make the electrode film discontinuous. Since the thickness of the opposite electrode 20 in the first embodiment is 16 nm, if the opposite electrode is made of only Ag, the Ag atoms aggregate one another into islands, resulting in a discontinuous film. Consequently, the resistivity of the opposite electrode 20 becomes too high to measure.

FIG. 3 is a diagram showing surface roughness of the opposite electrode 20 when the deposition rate ratio of Mg and Ag for forming the opposite electrode 20 of the light-emitting element Ug is 10:1, 3:1, 1:1, 1:3, 1:10, or 0:10. As shown in FIG. 3, the value indicating the surface roughness of the opposite electrode 20 in the case that the deposition rate ratio of Mg and Ag is 0:10 (the case that the opposite electrode 20 is made of only Ag) is larger than those in other cases. That is, it is confirmed that when the opposite electrode 20 is made of only Ag, the Ag atoms aggregate one another to generate asperities. In addition, it is confirmed that when the opposite electrode 20 is made of an alloy of Mg and Ag, Ag atoms are prevented from aggregating by Mg atoms intervening between the Ag atoms, resulting in a reduction in generation of asperities, compared to the case that the opposite electrode 20 is made of only Ag.

Thus, though the resistivity is decreased with an increase in the ratio of the deposition rate of Ag, Ag atoms aggregate one another into islands when the deposition rate ratio of Mg and Ag nears 0:100. Consequently, the resistivity of the opposite electrode 20 becomes significantly high, causing degradation in the ability of feeding power to the light-emitting elements that are integrated to form a panel. Therefore, it is necessary to set the upper limit of the deposition rate ratio of Mg and Ag within a range that can inhibit degradation of the power-feeding ability.

Figure 4:
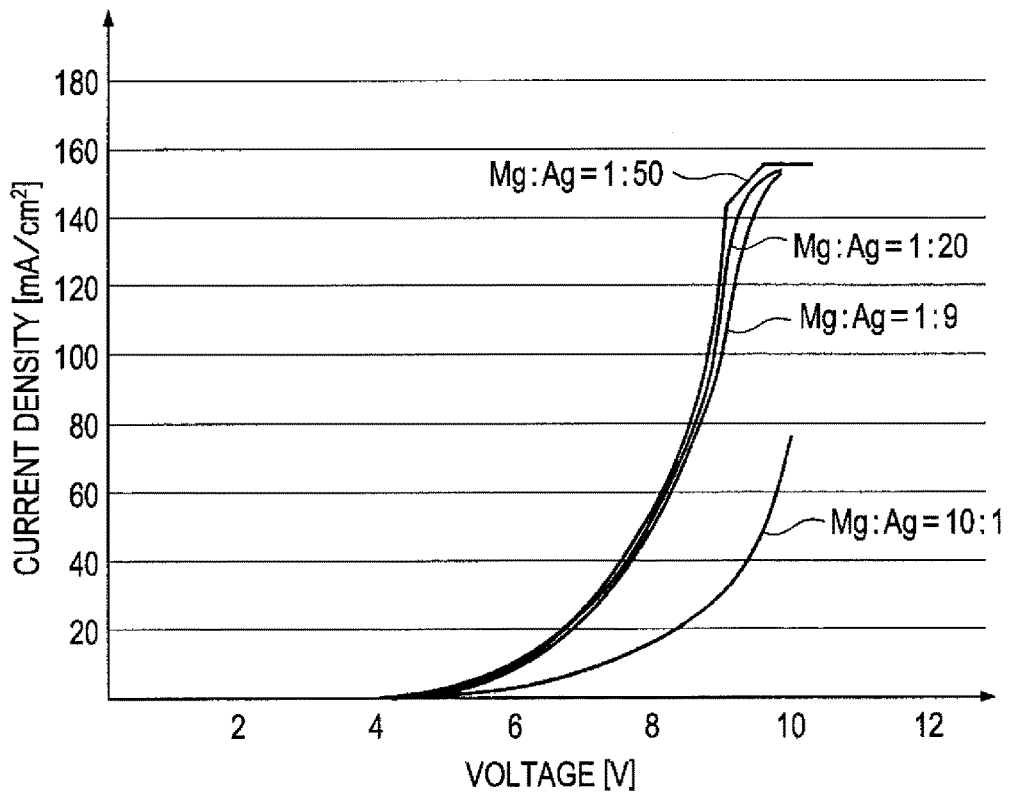
FIG. 4 is a graph showing a relationship between voltage applied between a pixel electrode and an opposite electrode and current density.

FIG. 4 is a graph showing a relationship between voltage applied between the pixel electrode 16 and the opposite electrode 20 and current density in the opposite electrode 20 when the deposition rate ratio of Mg and Ag for forming the opposite electrode 20 of the light-emitting element Ug is 10:1, 1:9, 1:20, or 1:50. In FIG. 4, it is confirmed that the current density under a constant voltage is increased with the ratio of Ag to Mg, that is, current can be efficiently injected by increasing the ratio of Ag to Mg. This is because that in the case of an electron-injection layer made of LiF, the electron injection property is enhanced by increasing the ratio of Ag in MgAg forming the opposite electrode 20 (cathode).

Figure 5:
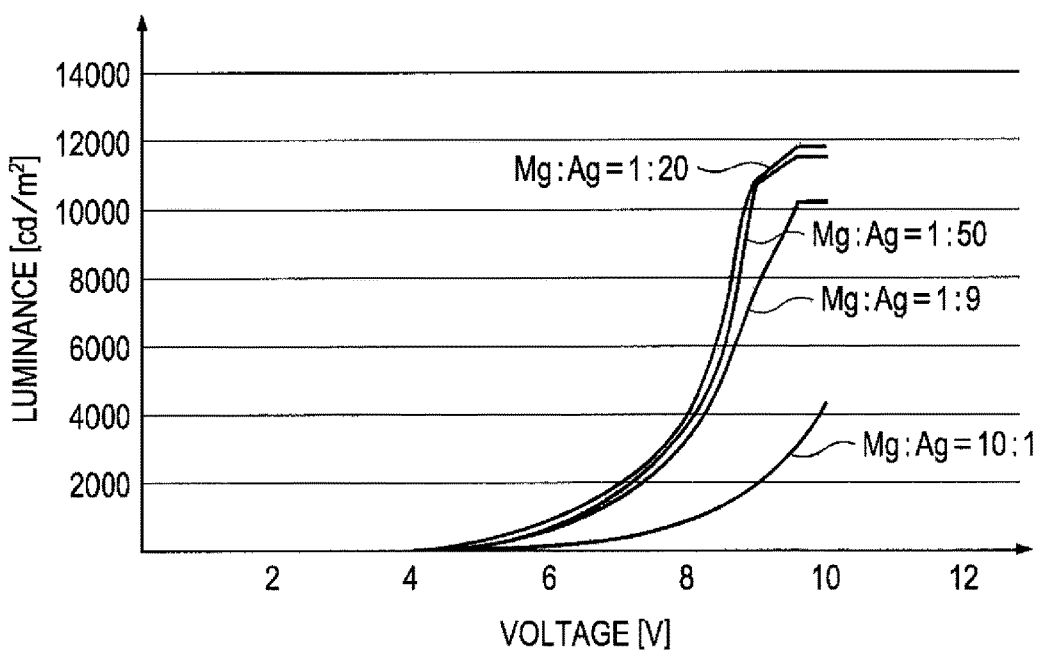
FIG. 5 is a graph showing a relationship between voltage applied between a pixel electrode and an opposite electrode and luminance of a light-emitting element.

FIG. 5 is a graph showing a relationship between voltage applied between the pixel electrode 16 and the opposite electrode 20 and luminance of the light-emitting element Ug when the deposition rate ratio of Mg and Ag for forming the opposite electrode 20 of the light-emitting element Ug is 10:1, 1:9, 1:20, or 1:50. In FIG. 5, it is confirmed that the luminance under a constant voltage is increased with an increase in the Ag ratio. It is believed that this is caused by the enhancement in the current injection property as shown in FIG. 4 and an efficient extraction of light by decreasing the loss in light extraction by increasing the Ag ratio.

Figure 6:
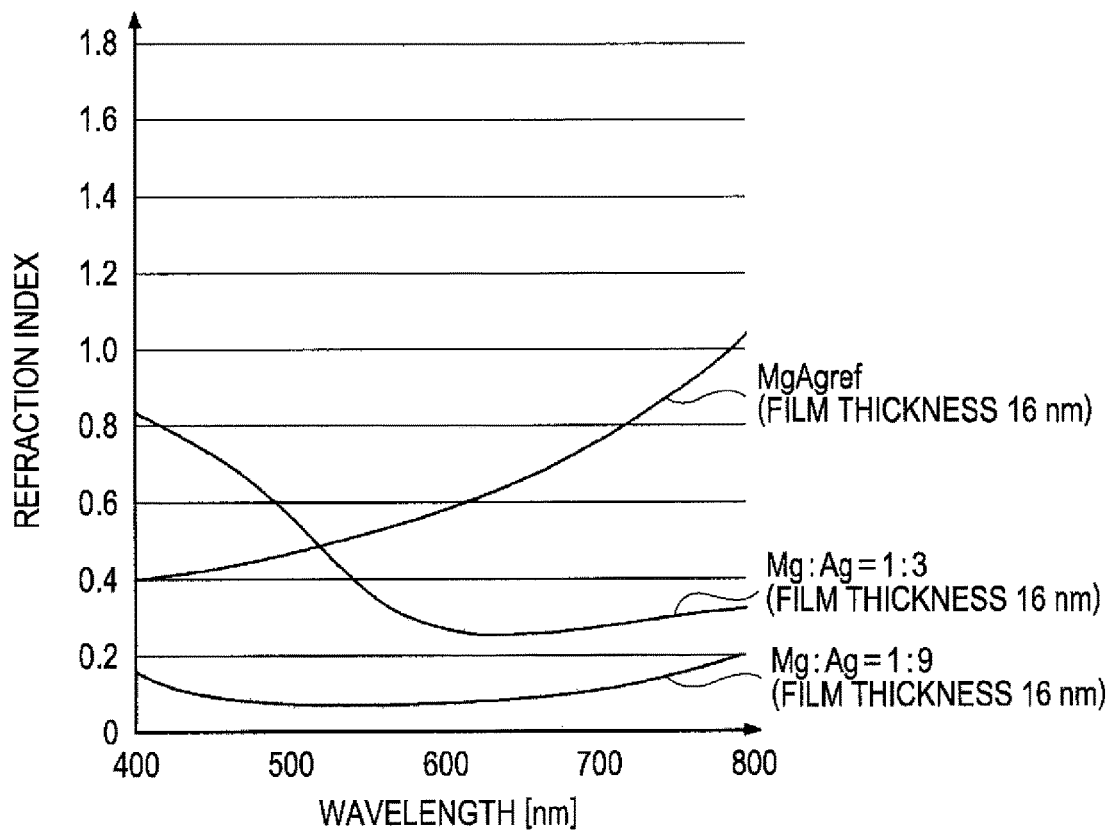
FIG. 6 is a graph showing refractive index characteristics of MgAg thin films having different Ag contents.
Figure 7:
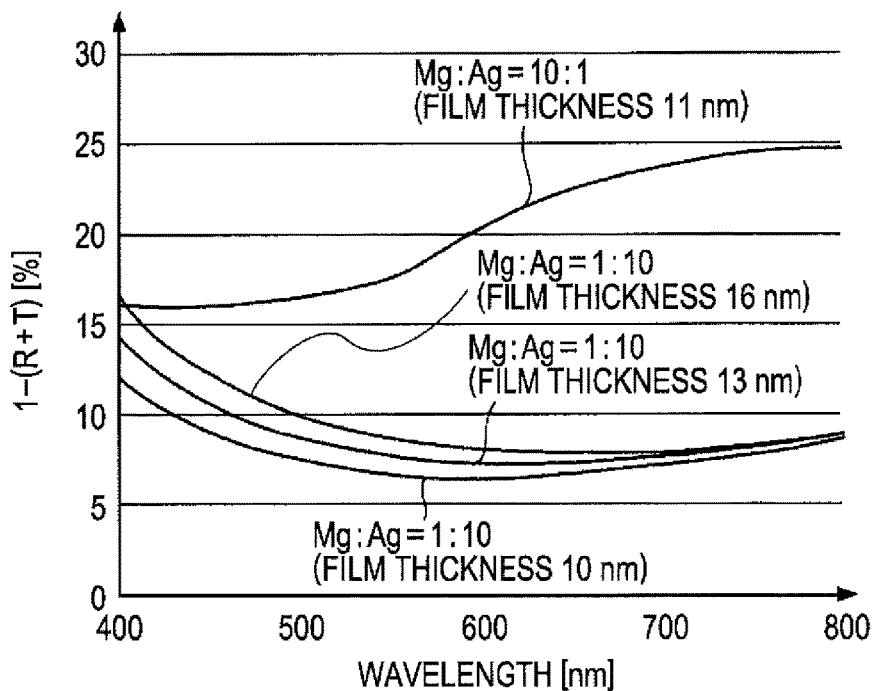
FIG. 7 is a graph showing optical-loss characteristics of MgAg thin films having different Ag contents and thicknesses.

FIG. 6 shows refractive index characteristics of MgAg thin films having different Ag contents. FIG. 7 shows optical-loss characteristics of MgAg thin films having different Ag contents and different thicknesses. On the vertical axis of FIG. 7, the "R" and the "T" denote reflectance and transmittance, respectively, of an MgAg thin film. The "1−(R+T)" denotes light-absorbing ratio of the MgAg thin film, and a larger value thereof means a larger optical loss.

In FIG. 7, a comparison of an MgAg thin film having a 11 nm thickness and formed at a deposition rate ratio of Mg and Ag of 10:1 and an MgAg thin film having a 10 nm thickness and formed at a deposition rate ratio of Mg and Ag of 1:10 reveals a difference in optical loss corresponding to the MgAg ratio when the thicknesses are similar (10 to 11 nm). In addition, as shown in FIG. 7, it is confirmed that even if the thickness is increased to 16 nm, a large optical loss is not caused, when the deposition ratio of Mg and Ag is 1:10. Therefore, the light-extracting efficiency is enhanced by increasing the Ag ratio.

Figure 8:
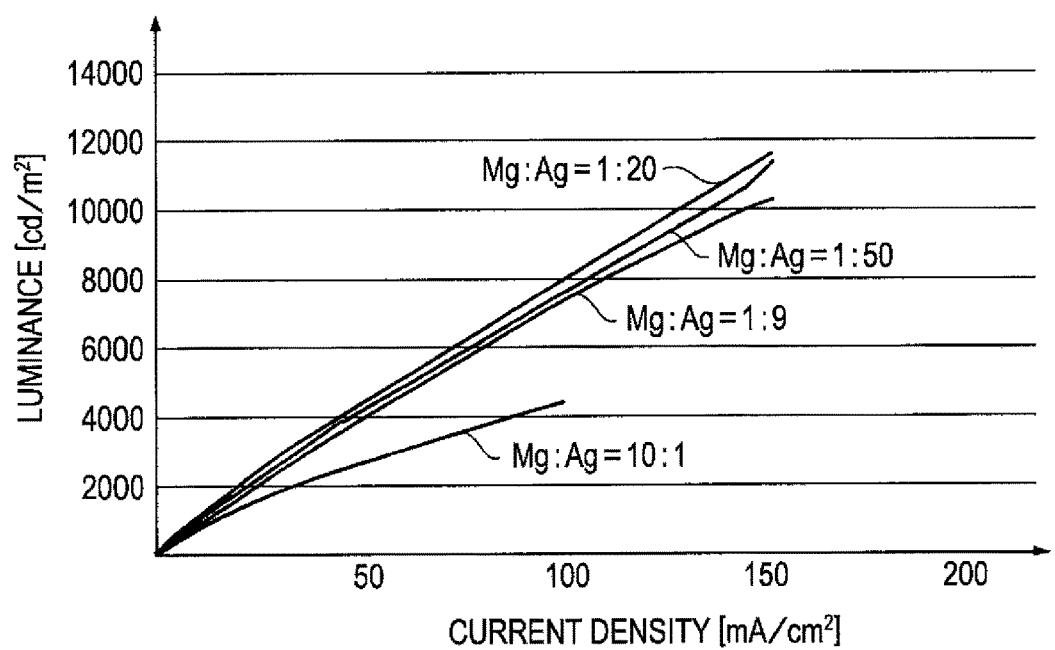
FIG. 8 is a graph showing a relationship between current density flowing in a light-emitting element and luminance of the light-emitting element.

FIG. 8 is a graph showing a relationship between current density flowing in a light-emitting element Ug and luminance of the light-emitting element Ug when the deposition rate ratio of Mg and Ag for forming the opposite electrode 20 of the light-emitting element Ug is 10:1, 1:9, 1:20, or 1:50. It is confirmed from FIG. 8 that the luminance under a constant current is increased with the Ag ratio. This is because that when the electron-injection layer is made of LiF, the electron injection property is enhanced by increasing the Ag ratio in the cathode (opposite electrode 20) disposed on the electron-injection layer. In addition, an increase in the Ag ratio improves the optical constant of the cathode to decrease the optical loss, resulting in enhancement of the light-extraction efficiency.

From the above, it is confirmed that the optimum Mg:Ag ratio is about 1:20.

Here, as shown in FIGS. 4, 5, and 8, a higher Ag ratio accelerates the current to flow in and luminance to flow out. However, an Mg:Ag of 1:50 makes the current slightly difficult to flow in and the luminance slightly difficult to flow out. In the first embodiment, an Mg:Ag of 1:20 looks like an optimum ratio. It is confirmed by observing light-emitting surfaces that the surface of a cathode at an Mg:Ag of 1:50 is roughened to cause poor light-emission and that degradation in characteristics due to a decrease in the film quality is caused by a too small Mg content. Accordingly, it is appropriate that the upper limit of the Ag content is determined to be 98%.

From the above, in the first embodiment, the deposition rate ratio of Mg and Ag for forming the opposite electrode 20 is set within the range of 2:1 to 1:50.

Furthermore, according to panel calculation, provided that the light-emitting elements shown in the first embodiment are used; the display size is 8 inches; the pixel aperture ratio is 60%; color filters and a circularly polarizing plate are mounted; and the display luminance is 150 cd/m$^2$, the sheet resistance required to the cathode is about 4.5Ω/□. The sheet resistance of a cathode having a 16 nm thickness estimated from the resistance values shown in FIG. 2 is about 4.5Ω/□ when the Mg:Ag is 1:20. This can satisfy the requirement above.

According to the first embodiment, since the resistivity of the opposite electrode 20 can be thus controlled to a predetermined standard value ($31 \times 10^{-8}$ Ω·m) or less, there is an advantage that the light-emitting element can have a good electrically conductive condition.

Incidentally, FIG. 2 shows that the values of current efficiency and power efficiency are high when the deposition rate ratios of Mg and Ag are 1:3, 1:9, 1:20, 1:50, and 0:100, compared to those in other cases. This is because that when the Ag content in the opposite electrode 20 is greater than a predetermined standard value (50% by atoms), LiF forming the electron-injection layer 49 sufficiently exhibits the electron injection property to further enhance the electrical conductivity of the light-emitting element. Therefore, it is also possible to set the deposition rate ratio of Mg and Ag in the range of 1:1 to 1:50 (more preferably 1:3 to 1:50) such that the electron-injection layer 49 sufficiently exhibits the electron injection property to impart a better electrically conductive condition to the light-emitting element.

A-2: Process of Producing Light-Emitting Device

Next, a process of producing the light-emitting device D1 of the first embodiment will be described with reference to FIGS. 9A to 9F, 10A, and 10B.

First, a plurality of light-reflecting layers 14 is formed in a matrix form on a first substrate 10 by a known method (Step P1: FIG. 9A), and pixel electrodes 16 are formed on the light-reflecting layers 14 (Step P2: FIG. 9B). Subsequently, a wall 12 is formed in a grid pattern (Step P3: FIG. 9C). For example, acryl or polyimide as a material for the wall 12 is mixed with a photosensitive material, and the wall 12 can be patterned by photolithographic exposure.

Then, a light-emitting function layer 18 is formed by a known method, such as deposition, so as to cover the wall 12 and the pixel electrodes 16 (Step P4: FIG. 9D). Then, an electron-injection layer 49 is formed on the light-emitting function layer 18 (Step P5: FIG. 9E). Furthermore, an opposite electrode 20 is formed on the electron-injection layer 49 (Step P6: FIG. 9F).

In Step P6, the opposite electrode 20 is formed by co-depositing Mg and Ag on the electron-injection layer 49. As described above, the deposition rate ratio of Mg and Ag is preferably set within the range of 2:1 to 1:50.

Figure 10A:
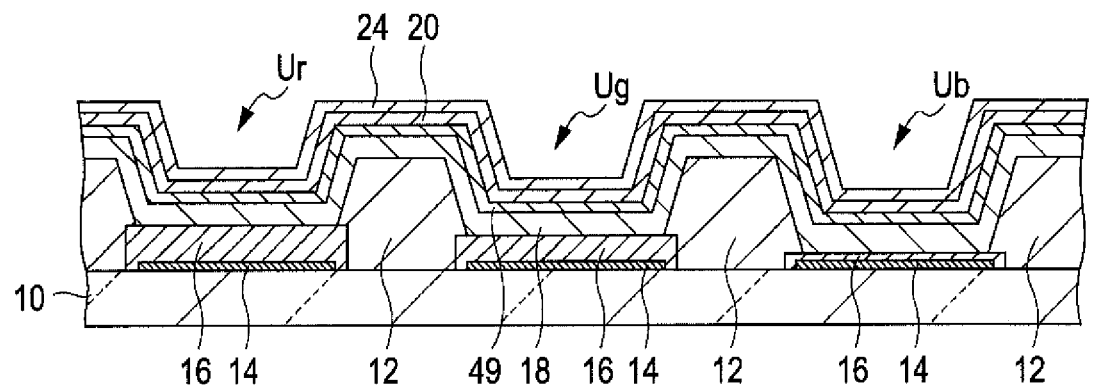
FIG. 10A is a cross-sectional view showing a step of the process for producing the light-emitting device according to the first embodiment.
Figure 10B:
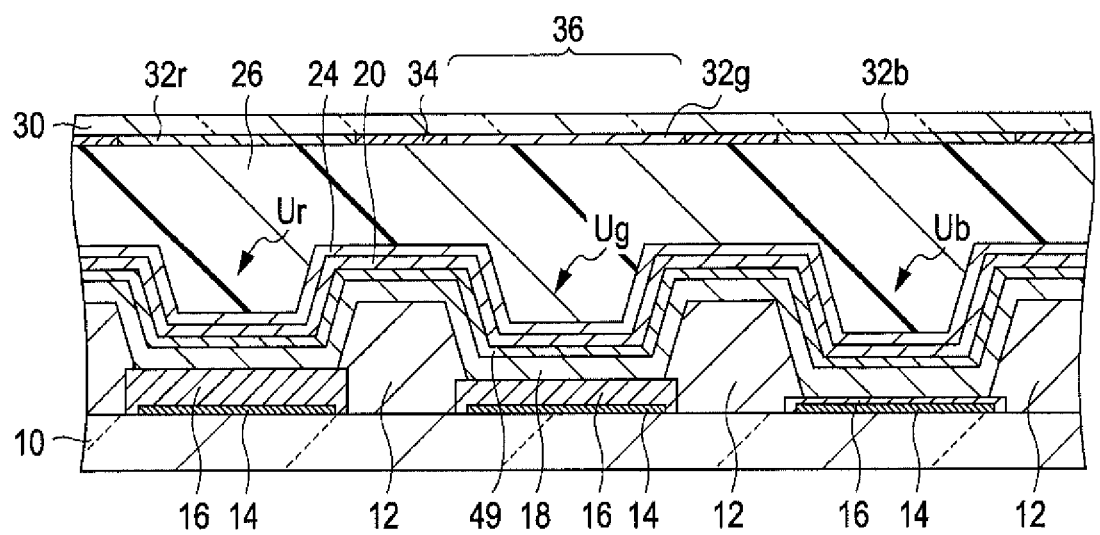
FIG. 10B is a cross-sectional view showing a step of the process for producing the light-emitting device according to the first embodiment.

Then, a passivation layer 24 is formed on the opposite electrode 20 (Step P7: FIG. 10A). Furthermore, a sealing layer 26 is applied onto the passivation layer 24, and then a second substrate 30 provided with color filters 32 and a light-shielding film 34 is bonded (Step P8: FIG. 10B). The light-emitting device D1 according to the first embodiment is thus produced.

B: Second Embodiment

In a second embodiment, the deposition rate ratio of Mg and Ag for forming the opposite electrode 20 is set to 1:9. Since the other configuration is the same as that of the first embodiment, the description thereof is omitted.

FIG. 11 is a diagram showing measurement results of various factors in each case that the thickness of the opposite electrode 20 of the light-emitting element Ug according to the second embodiment is 10 nm, 13 nm, or 16 nm. The sheet resistance values shown in FIG. 11 are those of the opposite electrode 20, and the values of voltage, current efficiency, and power efficiency are those when the density of current flowing in the opposite electrode 20 is set to 17.5 mA/cm$^2$. In addition, though it is not shown in the drawing, the values of the various factors when the thickness of the opposite electrode 20 is 20 nm are equivalent to those when the thickness is 16 nm.

As shown in FIG. 11, it is confirmed that the sheet resistance of the opposite electrode 20 is decreased with an increase in the thickness thereof and the characteristics such as voltage, current efficiency, and power efficiency are almost constant regardless of the thickness. That is, a larger thickness of the opposite electrode 20 is preferred within the range of 30 nm or less, in which the transparency of the opposite electrode 20 can be ensured. In addition, a larger thickness of the opposite electrode 20 has an advantage that the purity of color that is enhanced by resonance is raised.

C: Third Embodiment

Figure 12:
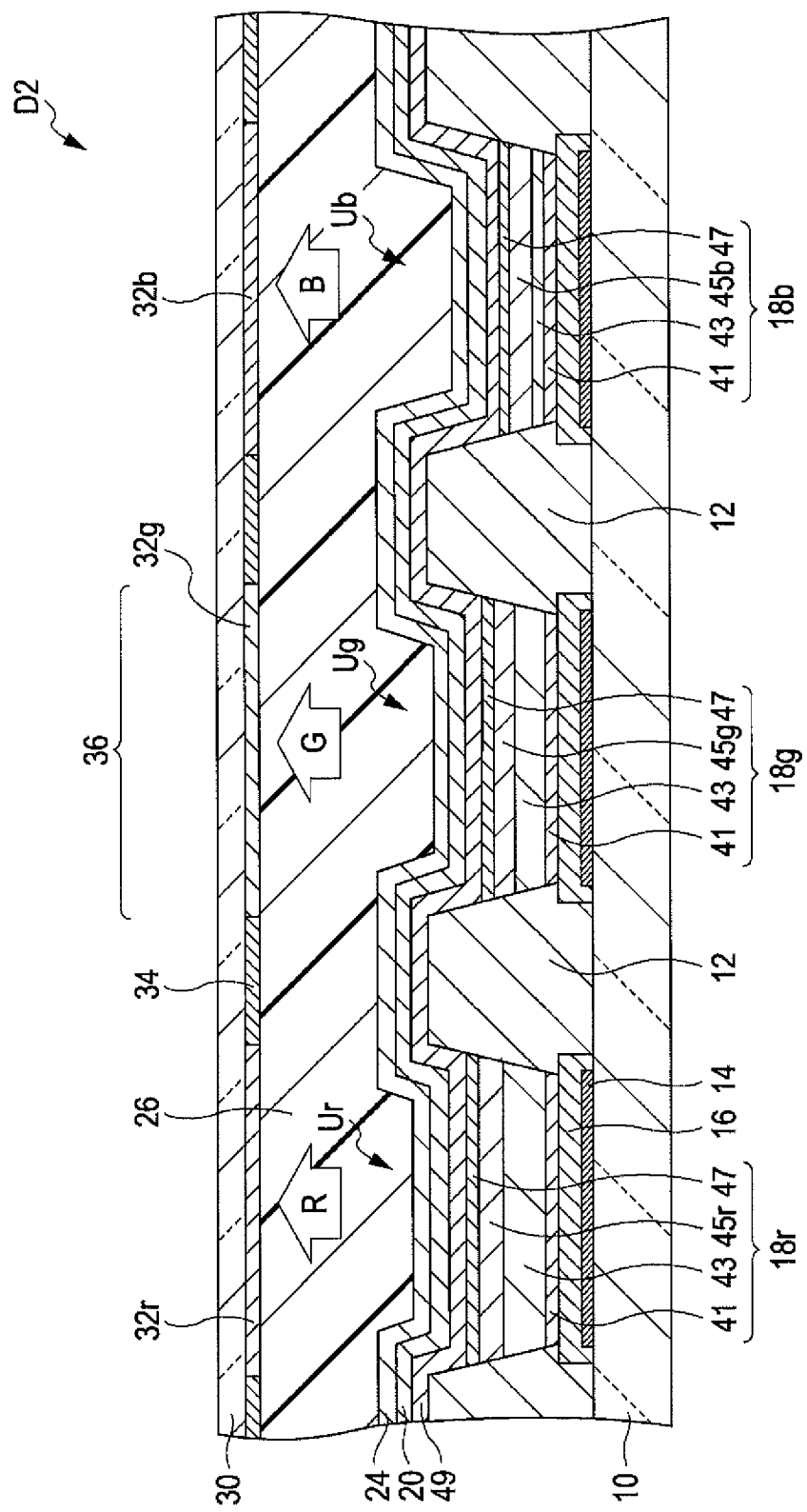
FIG. 12 is a cross-sectional view illustrating a structure of a light-emitting device according to a third embodiment.

FIG. 12 is a cross-sectional view illustrating a structure of a light-emitting device D2 according to a third embodiment of the invention. In the above-described embodiments, the light-emitting function layer 18 is common to all the light-emitting elements U, but in the third embodiment, the light-emitting function layer 18 is independently formed for each emission color of the light-emitting elements U.

As shown in FIG. 12, the light-emitting function layers 18 (18r, 18g, and 18b) each include a hole-injection layer 41 disposed on the pixel electrode 16, a hole-transporting layer 43 disposed on the hole-injection layer 41, a light-emitting layer 45 (45r, 45g, or 45b) disposed on the hole-transporting layer 43, and an electron-transporting layer 47 disposed on the light-emitting layer 45. The light-emitting function layer 18r of the light-emitting element Ur contains the light-emitting layer 45r made of an organic EL material that generates light of an R (red) wavelength range. The light-emitting function layer 18g of the light-emitting element Ug contains the light-emitting layer 45g made of an organic EL material that generates light of a G (green) wavelength range. The light-emitting function layer 18b of the light-emitting element Ub contains the light-emitting layer 45b made of an organic EL material that generates light of a B (blue) wavelength range. As shown in FIG. 12, the light-emitting function layers 18 are formed in the respective zones of the light-emitting elements U separated by a wall 12, and the adjacent light-emitting function layers 18 are not connected to each other.

In FIG. 12, the thicknesses of the hole-transporting layers 43 in the light-emitting elements U are controlled such that red color is enhanced in the light-emitting element Ur, green color is enhanced in the light-emitting element Ug, and blue color is enhanced in the light-emitting element Ub. Furthermore, in the third embodiment, the emission color of each light-emitting element U is enhanced by controlling the thickness of the hole-transporting layer 43 in each light-emitting element U, but the configuration is not limited thereto. The emission color of each light-emitting element U can be also enhanced by controlling the thickness of the pixel electrode 16, the hole-injection layer 41, the light-emitting layer 45, or the electron-transporting layer 47.

Also in the third embodiment, as in the above-described embodiments, since the resistivity of the opposite electrode 20 can be set to a predetermined standard value ($31 \times 10^{-8} \Omega \cdot m$) or less by setting the deposition rate ratio of Mg and Ag for forming the opposite electrode 20 within the range of 2:1 to 1:50, the light-emitting element can have a good electrically conductive condition.

D: Fourth Embodiment

D-1: Structure of Light-Emitting Device

Figure 13:
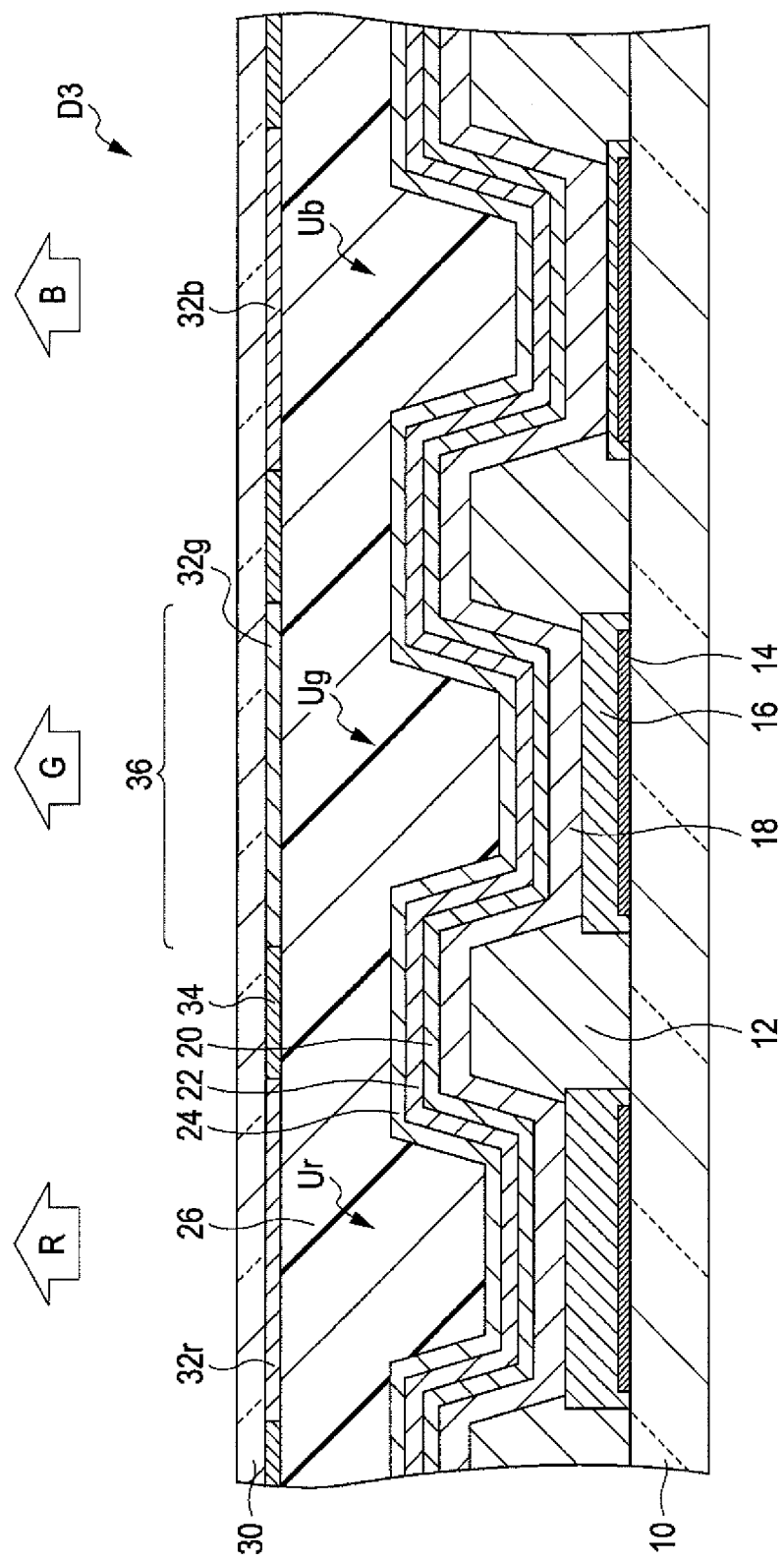
FIG. 13 is a cross-sectional view illustrating a structure of a light-emitting device according to a fourth embodiment.

FIG. 13 is a cross-sectional view illustrating a structure of a light-emitting device D3 according to a fourth embodiment of the invention. As shown in FIG. 13, the light-emitting device D3 has a configuration in which a plurality of light-emitting elements U (Ur, Ug, and Ub) is arrayed on a surface of a first substrate 10. Each light-emitting element U is an element generating light of a wavelength that corresponds to any of a plurality of colors (red, green, and blue). In the fourth embodiment, the light-emitting element Ur emits red light, the light-emitting element Ug emits green light, and the light-emitting element Ub emits blue light. The light-emitting device D3 according to the fourth embodiment is a top emission type in which light generated by each light-emitting element U is emitted toward the opposite side with respect to the first substrate 10. Therefore, the first substrate 10 may be made of an opaque plate-like material such as a ceramic or metal sheet, as well as a light-transmissive plate-like material such as glass.

The first substrate 10 is provided with wiring (not shown) for feeding power to the light-emitting elements U to emit light. Furthermore, the first substrate 10 is provided with circuits (not shown) for feeding power to the light-emitting elements U.

As shown in FIG. 13, a wall 12 (separator) is formed on the first substrate 10. The wall 12 separates the space on a surface of the first substrate 10 for each light-emitting element U and is made of a transparent insulative material such as acryl or polyimide.

Each of the plurality of light-emitting elements U includes a light-reflecting layer 14, a pixel electrode 16, a light-emitting function layer 18, and an opposite electrode 20. As shown in FIG. 13, a plurality of light-reflecting layers 14 is formed on the first substrate 10. The light-reflecting layers 14 are arranged so as to correspond to the respective light-emitting elements U. The light-reflecting layers 14 are made of a light-reflective material. Preferred examples of such a material include simple metals such as aluminum and silver and alloys whose main components are aluminum or silver. In the fourth embodiment, the light-reflecting layers 14 are made of a silver alloy available from Furuya Metal Co., Ltd. under the trade name "APC" and have a thickness of 80 nm.

The pixel electrodes 16 shown in FIG. 13 are anodes and are disposed on the respective light-reflecting layers 14 and surrounded by the wall 12. The pixel electrodes 16 are made of a transparent, electrically conductive oxide material, such as ITO, IZO, or $ZnO_2$. In the fourth embodiment, the pixel electrodes 16 are made of ITO and have different thicknesses that correspond to the respective emission colors of the light-emitting elements U. The details thereof will be described below. Alternatively, a transparent layer may be disposed between a reflective layer made of, for example, Ag and the pixel electrode 16. The optical length to obtain optimal resonance for the light emission wavelength required by the corresponding pixel can be optimized by optimizing the thickness of the first electrode (pixel electrode) or the transparent layer. Alternatively, the light-emitting function layers may have different thicknesses that correspond to the respective pixels described below.

The light-emitting function layer 18 is formed so as to cover each of the pixel electrodes 16 and the wall 12. That is, the light-emitting function layer 18 continues over the plurality of light-emitting elements U, and the characteristics of the light-emitting function layer 18 are equally applied to the plurality of light-emitting elements U. Though the details are not shown in the drawing, the light-emitting function layer 18 is composed of a hole-injection layer disposed on the pixel electrodes 16, a hole-transporting layer disposed on the hole-injection layer, a light-emitting layer disposed on the hole-transporting layer, an electron-transporting layer disposed on the light-emitting layer, and an electron-injection layer disposed on the electron-transporting layer.

In the fourth embodiment, the hole-injection layer is made of "HI-406", the trade name of Idemitsu Kosan Co., Ltd., and has a 40 nm thickness. The hole-transporting layer is made of "HT-320", the trade name of Idemitsu Kosan Co., Ltd., and has a 15 nm thickness. The hole-injection layer and the hole-transporting layer may be formed of a single layer having both functions of the hole-injection layer and the hole-transporting layer.

The light-emitting layer is made of an organic EL material that emits light by recombining holes and electrons. In the fourth embodiment, the organic EL material is a low molecular material and emits white light. The host material of the light-emitting layer is "BH-232", the trade name of Idemitsu Kosan Co., Ltd., and red, green, and blue dopants are mixed with the host material. In the fourth embodiment, "RD-001", "GD-206", and "BD-102", the trade names of Idemitsu Kosan Co., Ltd., are used as the red, green, and blue dopants, respectively. In the fourth embodiment, the thickness of the light-emitting layer is 65 nm.

In the fourth embodiment, the electron-transporting layer is made of Alq3 (tris(8-quinolinolato)aluminum complex) and has a 10 nm thickness. The electron-injection layer is made of LiF (lithium fluoride) and has a 1 nm thickness. Furthermore, the electron-transporting layer and the electron-injection layer may be formed of a single layer having both functions of the electron-transporting layer and the electron-injection layer.

The below-described light-emitting function layers 18 of a light-emitting device D5 according to a sixth embodiment, a light-emitting device D6 according to a seventh embodiment, and a light-emitting device D7 according to an eighth embodiment each have the same configuration as that of the light-emitting function layer 18 of the light-emitting device D3 according to the fourth embodiment.

The opposite electrode 20 shown in FIG. 13 is a cathode and is formed so as to cover the light-emitting function layer 18. That is, the opposite electrode 20 continues over the plurality of light-emitting elements U. The opposite electrode 20 functions as a semi-transparent reflective layer having a property that part of light reaching the surface thereof is transmitted and the remaining light is reflected (i.e., semi-transparent reflectivity) and is formed of a simple metal such as magnesium or silver or an alloy whose main component is magnesium or silver. In the fourth embodiment, the opposite electrode 20 is made of MgAg (magnesium-silver alloy). As described below, in the fourth embodiment, the opposite electrode 20 is formed by co-depositing Mg and Ag on the light-emitting function layer 18.

The thickness of the opposite electrode 20 is preferably within the range of 10 to 30 nm. This is because that when the thickness of the opposite electrode 20 is less than 10 nm, the resistance value of the opposite electrode 20 is high, resulting in insufficient electrical conductivity and that when the thickness is greater than 30 nm, the transparency of the opposite electrode 20 cannot be sufficiently ensured. In the fourth embodiment, the thickness of the opposite electrode 20 is 10 nm.

The light-emitting function layer 18 and the opposite electrode 20 are common to the plurality of light-emitting elements U. However, since the individual pixel electrodes 16 are separated from one another, when current flows between any of the pixel electrodes 16 and the opposite electrode 20, the light-emitting function layer 18 emits light only at a position where the light-emitting function layer 18 overlaps that pixel electrode 16. That is, the wall 12 separates the plurality of light-emitting elements U.

In the light-emitting device D3 according to the fourth embodiment, a resonator structure that resonates light emitted by the light-emitting function layer 18 is formed between the light-reflecting layer 14 and the opposite electrode 20. That is, the light emitted by the light-emitting function layer 18 goes and returns between the light-reflecting layer 14 and the opposite electrode 20, and light with a specific wavelength is enhanced by resonance and passes through the opposite electrode 20 to travel toward the observer side (upside in FIG. 13) (top emission).

The thicknesses of the pixel electrodes 16 in light-emitting elements U are controlled such that red color in the white light emitted by the light-emitting function layer 18 is enhanced in the light-emitting element Ur, green color is enhanced in the light-emitting element Ug, and blue color is enhanced in the light-emitting element Ub. More specifically, in the fourth embodiment, the pixel electrode 16 of the light-emitting element Ur has a 110 nm thickness, the pixel electrode 16 of the light-emitting element Ug has a 70 nm thickness, and the pixel electrode 16 of the light-emitting element Ub has a 27 nm thickness.

The stress-absorbing layer 22 shown in FIG. 13 is a first layer for absorbing stress to the opposite electrode 20 and is formed so as to cover the opposite electrode 20. The stress-absorbing layer 22 has light transmittance and moisture resistance and is made of a material that is softer than those of the opposite electrode 20 and the below-described passivation layer 24. The stress-absorbing layer 22 is made of the same material as that of the electron-injection layer of the light-emitting function layer 18, for example, LiF, LiO$_2$, Liq, MgO, MgF$_2$, CaF$_2$, SrF$_2$, NaF, or WF. In the fourth embodiment, the stress-absorbing layer 22 is made of LiF and has a 10 nm thickness.

As shown in FIG. 13, the passivation layer 24 is disposed on the stress-absorbing layer 22. The passivation layer 24 is a protection layer for preventing infiltration of water and the air into the light-emitting elements U and is formed as a second layer made of an inorganic material having a low gas transmittance, such as SiN (silicon nitride) or SiON (silicon oxynitride). In the fourth embodiment, the passivation layer 24 is made of SiON (silicon oxynitride) and has a 400 nm thickness.

As shown in FIG. 13, in the fourth embodiment, a second substrate 30 is disposed so as to face the plurality of light-emitting elements U disposed on the first substrate 10. The second substrate 30 is made of a light transmissive material such as glass and is provided with color filters 32 and a light-shielding film 34 on the surface facing the first substrate 10. The light-shielding film 34 is a film having a light-shielding property and is provided with openings 36 at positions corresponding to the respective light-emitting elements U. The color filters 32 are disposed in the openings 36.

In the fourth embodiment, a red color filter 32r that selectively transmits red light is disposed in the opening 36 corresponding to the light-emitting element Ur, a green color filter 32g that selectively transmits green light is disposed in the opening 36 corresponding to the light-emitting element Ug, and a blue color filter 32b that selectively transmits blue light is disposed in the opening 36 corresponding to the light-emitting element Ub.

The second substrate 30 provided with the color filters 32 and the light-shielding film 34 is bonded to the first substrate 10 via a sealing layer 26. The sealing layer 26 is made of a transparent resin material, for example, a hardening resin such as an epoxy resin. The structure of the light-emitting device D3 of the fourth embodiment is as above.

Incidentally, when the opposite electrode 20 is made of MgAg as in fourth embodiment, it is preferred to increase the ratio of Ag, which is superior to Mg in electrical conductivity, for enhancing the conductive property of the light-emitting elements U. However, since Ag atoms are applied with force to bind to one another (aggregating force), if the Ag content of the opposite electrode 20 is greater than a predetermined standard value, the Ag atoms aggregate with one another to generate asperities. In such a case, when the passivation layer 24 is formed directly on the opposite electrode 20, the load of the passivation layer 24 is applied to the opposite electrode 20. Therefore, if the asperities of the opposite electrode 20 are excessive, the opposite electrode 20 is broken, resulting in a problem that the electrical conductivity of the light-emitting elements U is decreased.

In the fourth embodiment, it has been found that when the ratio of the deposition rate of Ag (equivalent to the atomic number ratio in XRF analyzer) is less than Mg:Ag=1:3, the opposite electrode 20 is not broken even if the passivation layer 24 is formed directly on the opposite electrode 20, whereas when the atomic number ratio of Ag is greater than Mg:Ag=1:3, the Ag atoms aggregate with one another to generate asperities to cause breakage of the opposite electrode 20 due to the passivation layer 24 formed directly on the opposite electrode 20. From the finding above, in the fourth embodiment, the deposition rate ratio (equivalent to the atomic number ratio in XRF analyzer) of Mg and Ag for forming the opposite electrode 20 is set in the range of 1:3 to 1:50, and also a configuration in which the passivation layer 24 is disposed on the stress-absorbing layer 22 covering the opposite electrode 20 is employed.

In the fourth embodiment, since the atomic number ratio of Ag is set to Mg:Ag=1:3 or more, asperities are generated in the opposite electrode 20. However, since the passivation layer 24 is formed on the stress-absorbing layer 22 covering the opposite electrode 20, the load of the passivation layer 24 is dispersed to the stress-absorbing layer 22. This prevents the opposite electrode 20 from being broken due to stress, resulting in an advantage that the light-emitting elements U have a good electrically conductive condition.

Figure 14:
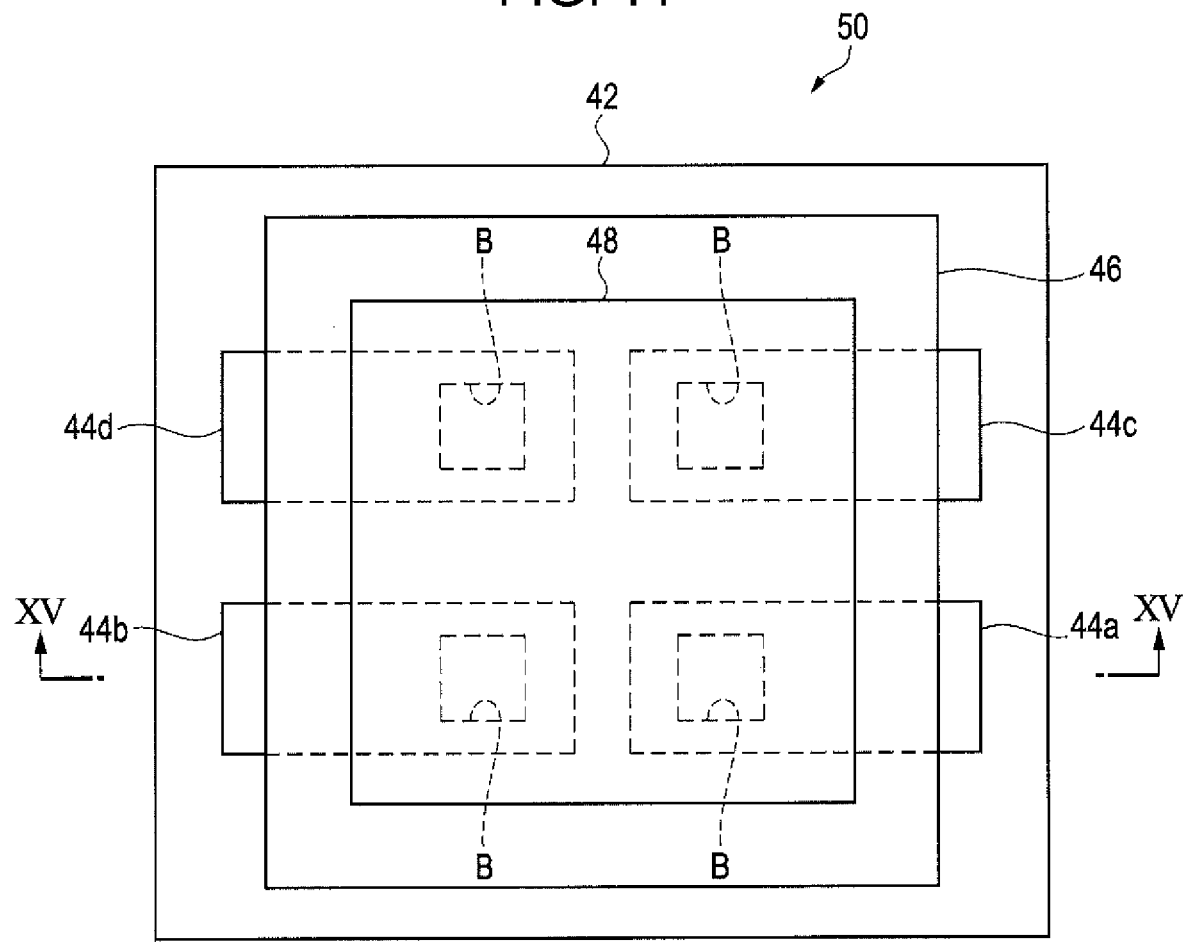
FIG. 14 is a plan view schematically illustrating a judging device for judging whether a sample is broken or not.
Figure 15:
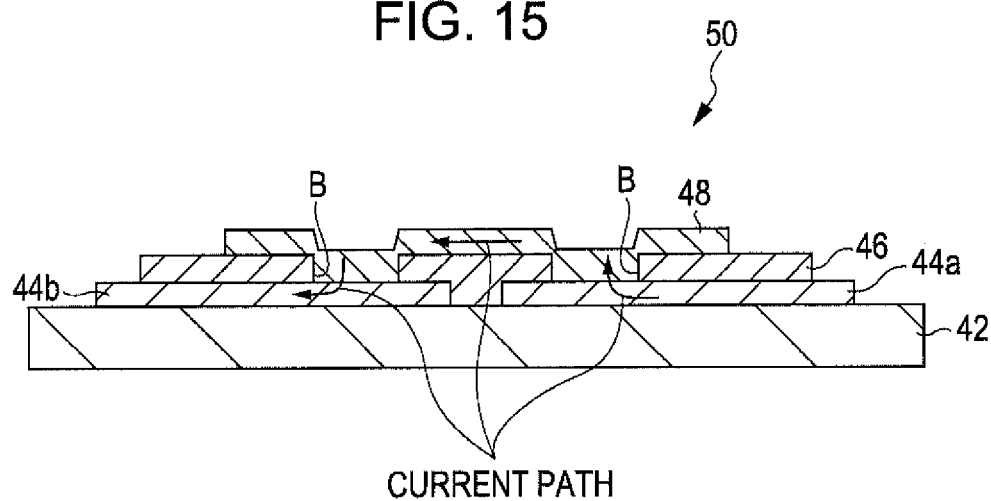
FIG. 15 is a cross-sectional view schematically illustrating the judging device for judging whether a sample is broken or not.

FIG. 14 is a plan view schematically illustrating a judging device 50 for judging whether a sample of the opposite electrode 20 produced at an atomic number ratio of Mg and Ag of 1:9 is broken or not. FIG. 15 is a cross-sectional view taken along the line XV-XV in FIG. 14.

The judging device 50 is composed of a testing substrate 42, four testing electrodes 44 (from 44a to 44d) disposed on the testing substrate 42, a wall 46 in a grid pattern for separating the four testing electrodes 44, and a testing thin metal film 48 disposed on the testing electrodes 44 at regions separated by the wall 46 (regions surrounded by the openings B shown in FIG. 14) and on the wall 46. The testing thin metal film 48 is a sample of the opposite electrode 20 produced at an atomic number ratio of Mg and Ag of 1:9.

In the fourth embodiment, the method for judging whether a sample is broken or not will be described with reference to FIG. 15. The resistance value of a current path from the testing electrode 44a to the adjacent testing electrode 44b via a sample (testing thin metal film 48) (or a current path from the testing electrode 44b to the testing electrode 44a via the sample) is measured by bringing terminals of a tester into contact with the testing electrodes 44a and 44b. If the sample is broken, the resistance value measured by the tester is significantly high. Therefore, whether the sample is broken or not can be judged based on the resistance value.

FIG. 16 is a diagram showing resistance values measured by the tester when a passivation layer 24 is formed directly on a sample (testing thin metal film 48) and when a stress-absorbing layer 22 having a thickness of 10 nm, 25 nm, or 50 nm is disposed between a passivation layer 24 and a sample. In all cases shown in FIG. 16, the samples have a 13 nm thickness, and the stress-absorbing layers 22 are made of LiF.

As shown in FIG. 16, it is confirmed that the resistance value when the passivation layer 24 is formed directly on a sample is significantly large (about 10 MΩ), resulting in breakage of the sample. On the other hand, when a stress-absorbing layer 22 made of LiF is disposed between the passivation layer 24 and the sample, the resistance values are approximately the same, about 5Ω, in all cases that the thickness of the stress-absorbing layer 22 is 10 nm, 25 nm, or 50 nm, and therefore no breakage is observed in the samples.

FIG. 17 is a diagram showing resistance values when the stress-absorbing layer 22 is made of $CaF_2$, instead of LiF, and has a thickness of 10 nm, 25 nm, or 50 nm. In all cases shown in FIG. 17, the resistance is measured for a configuration in which a stress-absorbing layer 22 is disposed between the passivation layer 24 and the sample. As shown in FIG. 17, the resistance values are approximately the same, about 5Ω, in all cases that the thickness of the stress-absorbing layer 22 is 10 nm, 25 nm, or 50 nm.

FIG. 18 is a diagrams showing resistance values when the stress-absorbing layer 22 is made of $Li_2O$ and has a thickness of 10 nm, 25 nm, or 50 nm. In all cases shown in FIG. 18, the resistance is measured for a configuration in which a stress-absorbing layer 22 is disposed between the passivation layer 24 and the sample. Also in the cases shown in FIG. 18, the resistance values are approximately the same, about 5Ω, in all cases that the thickness of the stress-absorbing layer 22 made of $Li_2O$ is 10 nm, 25 nm, or 50 nm.

FIG. 19 is a diagrams showing resistance values when the stress-absorbing layer is made of $MgF_2$ and has a thickness of 10 nm, 25 nm, or 50 nm. In all cases shown in FIG. 19, the resistance is measured for a configuration in which a stress-absorbing layer 22 is disposed between the passivation layer 24 and the sample. Also in the cases shown in FIG. 19, the resistance values are approximately the same, about 5Ω, in all cases that the thickness of the stress-absorbing layer 22 made of $MgF_2$ is 10 nm, 25 nm, or 50 nm.

From the above, it is confirmed that a sample is prevented from being broken due to stress by employing a configuration in which a stress-absorbing layer 22 is disposed between the passivation layer 24 and the sample.

D-2: Process of Producing Light-Emitting Device

Next, a process of producing any of the light-emitting device D3 of the fourth embodiment, the below-described light-emitting device D7 of an eighth embodiment, and the below-described light-emitting device D8 of a ninth embodiment will be described with reference to FIGS. 20A to 20E and FIGS. 21A to 21C.

Figure 20A:
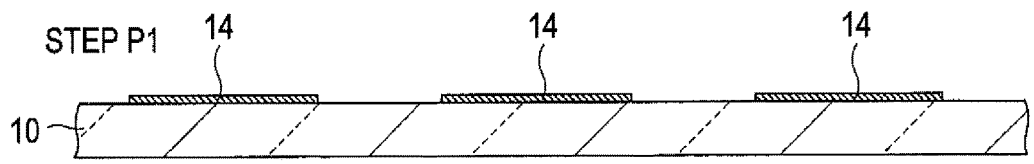
FIG. 20A is a cross-sectional view showing a step of a process for producing a light-emitting device according to the fourth embodiment.
Figure 20B:
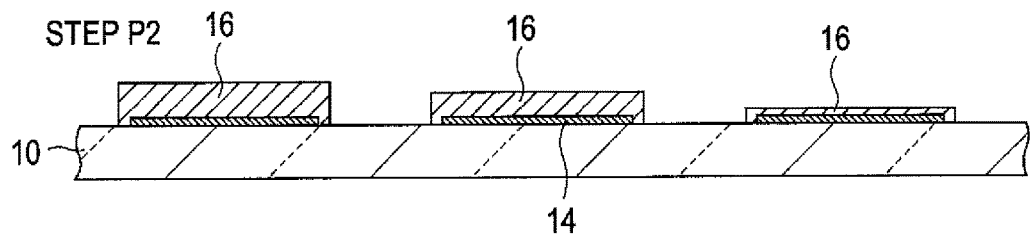
FIG. 20B is a cross-sectional view showing a step of the process for producing the light-emitting device according to the fourth embodiment.
Figure 20C:
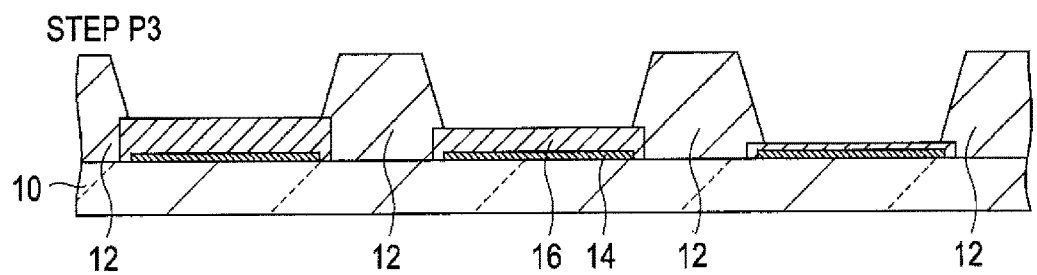
FIG. 20C is a cross-sectional view showing a step of the process for producing the light-emitting device according to the fourth embodiment.

First, a plurality of light-reflecting layers 14 is formed in a matrix form on a first substrate 10 by a known method (Step P1: FIG. 20A), and pixel electrodes 16 are formed on the light-reflecting layers 14 (Step P2: FIG. 20B). Subsequently, a wall 12 is formed in a grid pattern (Step P3: FIG. 20C). For example, acryl or polyimide as a material for the wall 12 is mixed with a photosensitive material, and the wall 12 can be patterned by photolithographic exposure.

Figure 20D:
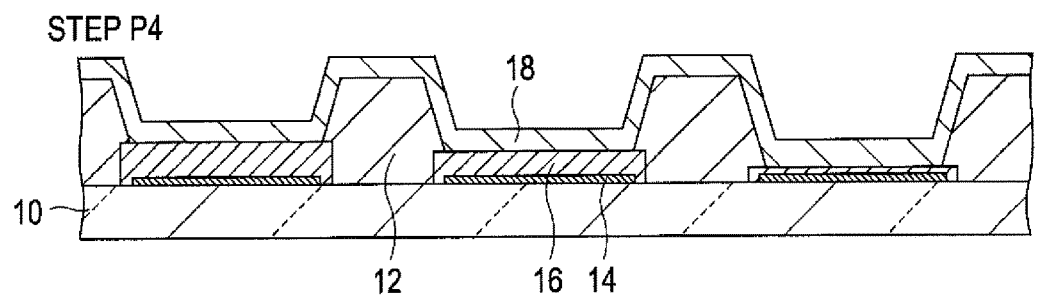
FIG. 20D is a cross-sectional view showing a step of the process for producing the light-emitting device according to the fourth embodiment.
Figure 20E:
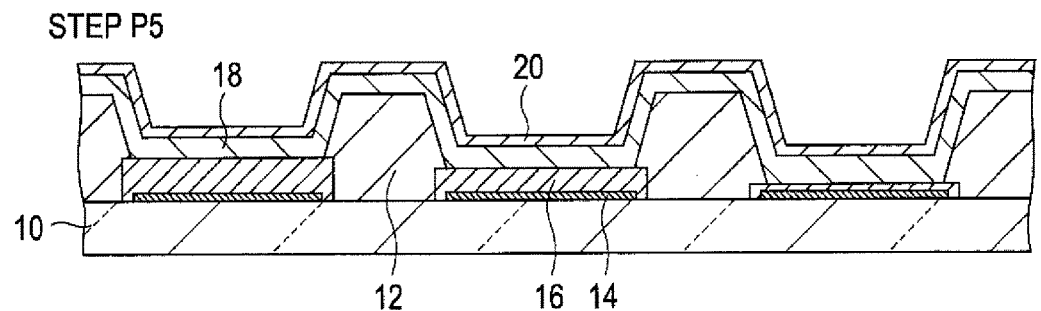
FIG. 20E is a cross-sectional view showing a step of the process for producing the light-emitting device according to the fourth embodiment.

Then, a light-emitting function layer 18 is formed by a known method, such as deposition, so as to cover the wall 12 and the pixel electrodes 16 (Step P4: FIG. 20D). Furthermore, an opposite electrode 20 is formed on the light-emitting function layer 18 (Step P5: FIG. 20E).

In Step P5, the opposite electrode 20 is formed by co-depositing Mg and Ag on the light-emitting function layer 18. As described above, in the fourth embodiment, the deposition rate ratio (equivalent to the atomic number ratio in XRF analyzer) of Mg and Ag is preferably set within the range of 1:3 to 1:50.

Figure 21A:
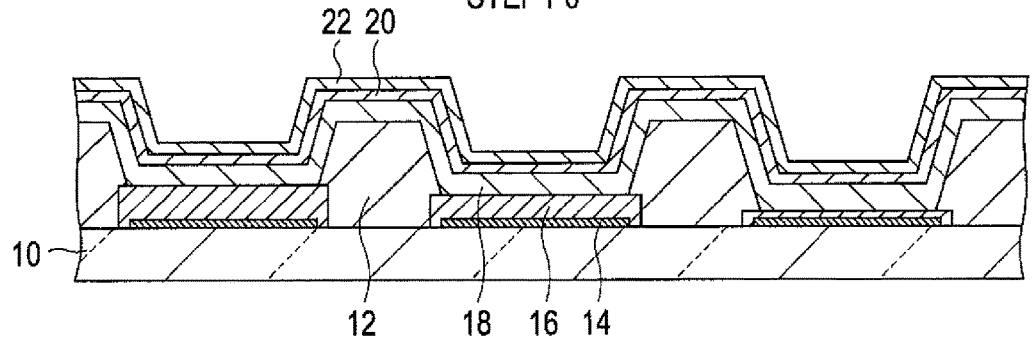
FIG. 21A is a cross-sectional view showing a step of the process for producing the light-emitting device according to the fourth embodiment.
Figure 21B:
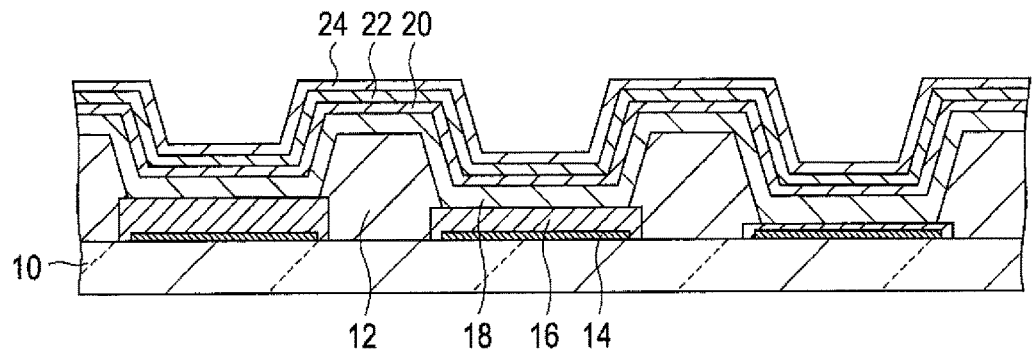
FIG. 21B is a cross-sectional view showing a step of the process for producing the light-emitting device according to the fourth embodiment.

Then, a stress-absorbing layer 22 is formed on the opposite electrode 20 (Step P6: FIG. 21A), and a passivation layer 24 is formed on the stress-absorbing layer 22 (Step P7: FIG. 21B). Here, the stress-absorbing layer 22 is preferably formed by deposition (heat deposition). In such a method, the light-emitting function layer 18 and the opposite electrode 20 as bases are inhibited from being damaged. In addition, the passivation layer 24 is preferably formed with a device including a plasma generator. In such a method, a dense film layer can be formed, resulting in an increase in reliability of the light-emitting elements U and the light-emitting device D3 (D7, D8).

Figure 21C:
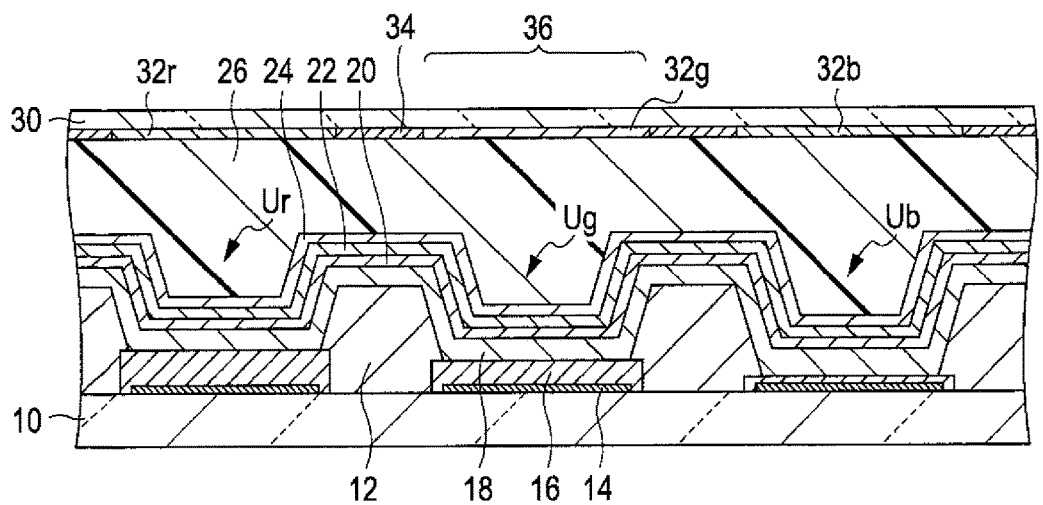
FIG. 21C is a cross-sectional view showing a step of the process for producing the light-emitting device according to the fourth embodiment.

Furthermore, a sealing layer 26 is applied onto the passivation layer 24, and then a second substrate 30 provided with color filters 32 and a light-shielding film 34 is bonded (Step P8: FIG. 21C). The light-emitting device D3 according to the fourth embodiment is thus produced.

E: Fifth Embodiment

Figure 22:
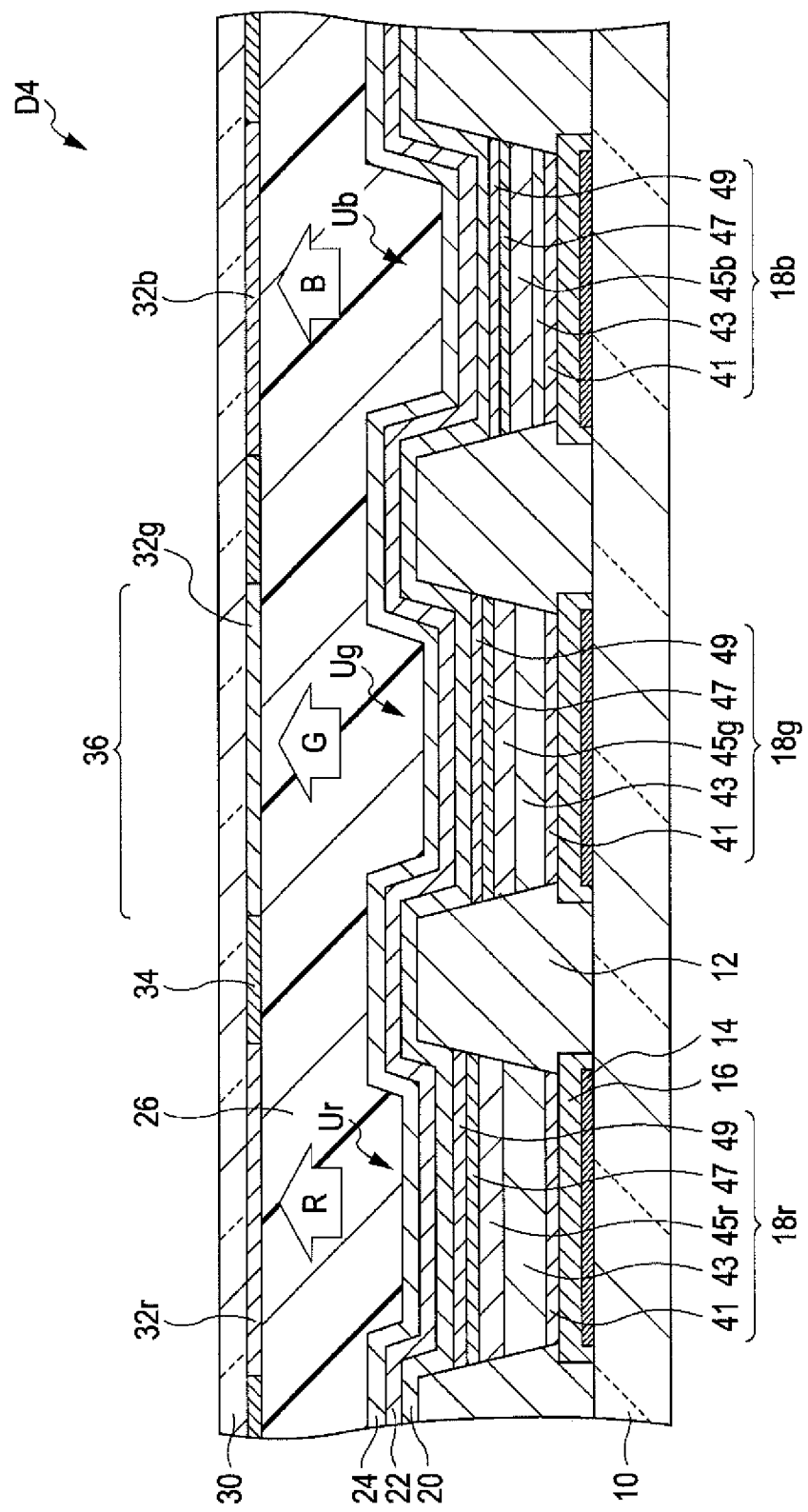
FIG. 22 is a cross-sectional view illustrating a structure of a light-emitting device according to a fifth embodiment.

FIG. 22 is a cross-sectional view illustrating a structure of a light-emitting device D4 according to a fifth embodiment of the invention. In the above-described fourth embodiment, the light-emitting function layer 18 is common to all the light-emitting elements U. In the fifth embodiment, the light-emitting function layer 18 is independently formed for each emission color of the light-emitting elements U.

As shown in FIG. 22, the light-emitting function layers 18 (18r, 18g, and 18b) are each composed of a hole-injection layer 41 disposed on the pixel electrode 16, a hole-transporting layer 43 disposed on the hole-injection layer 41, a light-emitting layer 45 (45r, 45g, or 45b) disposed on the hole-transporting layer 43, an electron-transporting layer 47 disposed on the light-emitting layer 45, and an electron-injection layer 49 disposed on the electron-transporting layer 47. The light-emitting function layer 18r of the light-emitting element Ur contains the light-emitting layer 45r made of an organic EL material that generates light of an R (red) wavelength range. The light-emitting function layer 18g of the light-emitting element Ug contains the light-emitting layer 45g made of an organic EL material that generates light of a G (green) wavelength range. The light-emitting function layer 18b of the light-emitting element Ub contains the light-emitting layer 45b made of an organic EL material that generates light of a B (blue) wavelength range. As shown in FIG. 22, the light-emitting function layers 18 are formed in the respective zones of the light-emitting elements U separated by a wall 12, and the adjacent light-emitting function layers 18 are not connected to each other.

In FIG. 22, the thicknesses of the hole-transporting layers 43 in the light-emitting elements U are controlled such that red color is enhanced in the light-emitting element Ur, green color is enhanced in the light-emitting element Ug, and blue color is enhanced in the light-emitting element Ub. In the fifth embodiment, the emission color of each light-emitting element U is enhanced by controlling the thickness of the hole-transporting layer 43 in each light-emitting element U, but the configuration is not limited thereto. The emission color of each light-emitting element U can be also enhanced by controlling the thickness of the pixel electrode 16, the hole-injection layer 41, the light-emitting layer 45, the electron-transporting layer 47, or the electron-injection layer 49.

In also the fifth embodiment, as in the above-described embodiments, the deposition rate ratio (atomic number ratio) of Mg and Ag for forming the opposite electrode 20 is set within the range of 1:3 to 1:50. Then, the opposite electrode 20 is covered by a stress-absorbing layer 22, and a passivation layer 24 is disposed on the stress-absorbing layer 22. Therefore, the load of the passivation layer 24 is dispersed to the stress-absorbing layer 22. This prevents the opposite electrode 20 from being broken due to stress.

F: Sixth Embodiment

Figure 23:
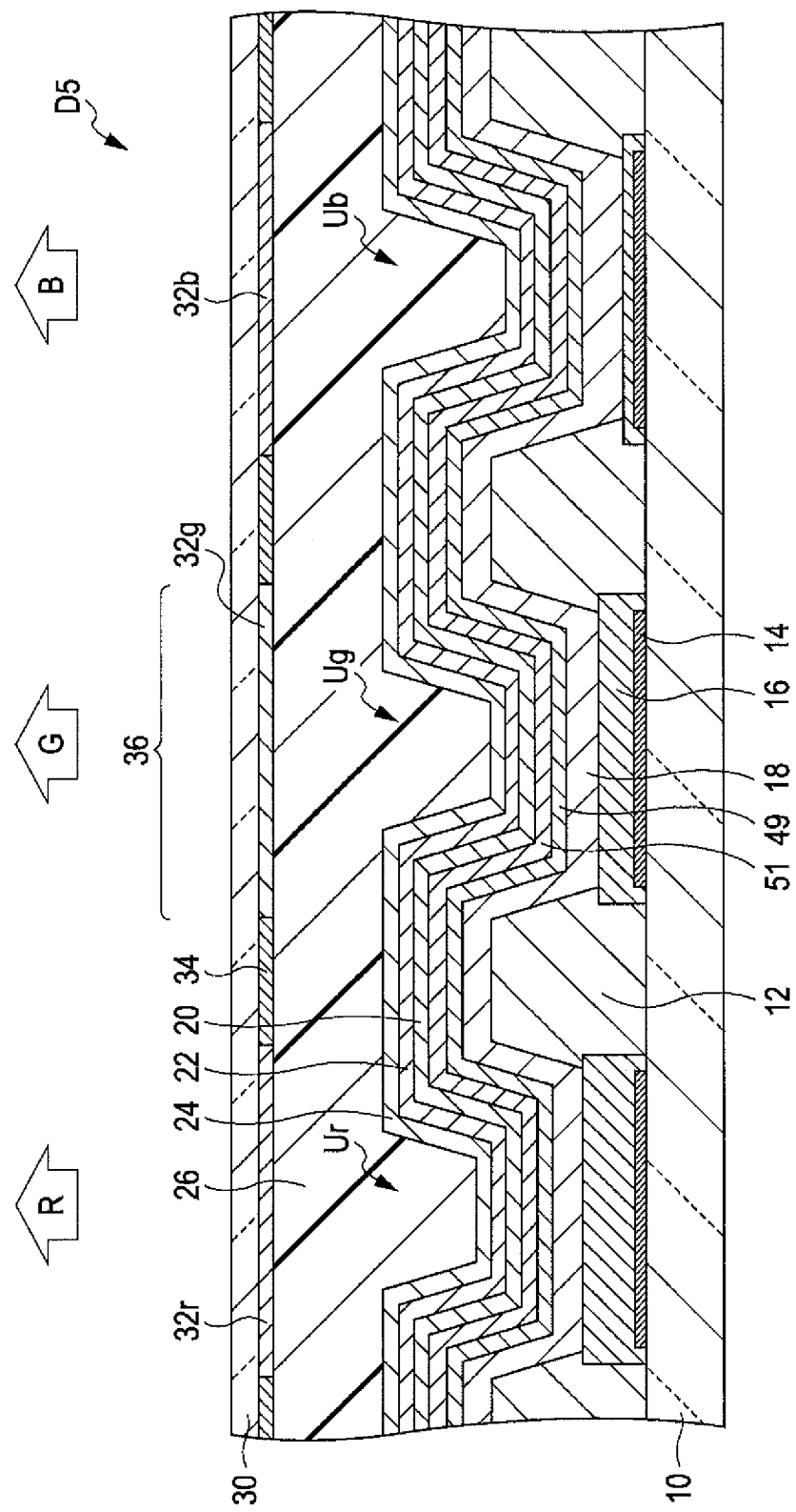
FIG. 23 is a cross-sectional view illustrating a structure of a light-emitting device according to a sixth embodiment.

FIG. 23 is a cross-sectional view illustrating a structure of a light-emitting device D5 according to a sixth embodiment of the invention. Though the details are not shown in the drawing, the light-emitting function layer 18 is composed of a hole-injection layer disposed on the pixel electrodes 16, a hole-transporting layer disposed on the hole-injection layer, a light-emitting layer disposed on the hole-transporting layer, and an electron-transporting layer disposed on the light-emitting layer.

As shown in FIG. 23, an electron-injection layer 49 is disposed on the light-emitting function layer 18 for enhancing the efficiency of electron injection to the light-emitting function layer 18. In the sixth embodiment, the electron-injection layer 49 is made of LiF and has a 1 nm thickness.

As shown in FIG. 23, a reduction layer 51 is disposed on the electron-injection layer 49. The reduction layer 51 is made of a reducible metal material for reducing the electron-injecting material forming the electron-injection layer 49. In the sixth embodiment, the reduction layer 51 is made of Al and has a 2 nm thickness.

As shown in FIG. 23, an opposite electrode 20 is disposed on the reduction layer 51. In the sixth embodiment, the opposite electrode 20 is made of only Ag. The thickness of the opposite electrode 20 is desirably in the range of 10 to 20 nm as in the above-described fourth embodiment. In the sixth embodiment, the thickness of the opposite electrode 20 is set to 13 nm. In the above-mentioned points, the configuration of the sixth embodiment is different from that of the fourth embodiment. Since the other configuration is the same as that of the fourth embodiment, the description thereof is omitted.

In the sixth embodiment, the Ag atoms forming the opposite electrode 20 can be prevented from aggregating with one another into islands (breakage of the film) by using the reducible metal material (Al in the sixth embodiment) forming the reduction layer 51 as a base of the opposite electrode 20. Consequently, the opposite electrode 20 can be a continuous film. However, the aggregation of the Ag atoms cannot be completely inhibited, and the opposite electrode 20 according to the sixth embodiment has asperities. In addition, since the material of the opposite electrode 20 is different from that of the passivation layer 24 disposed thereon, their physical constants, such as a thermal expansion coefficient, are different. Therefore, stress is generated between these layers. In particular, the stress increases with the ratio of Ag and causes peeling of the opposite electrode 20, resulting in a decrease in electrical conductivity of the light-emitting elements U.

In the sixth embodiment, as in the fourth embodiment, the opposite electrode 20 is covered by a stress-absorbing layer 22, and a passivation layer 24 is formed on the stress-absorbing layer 22. Therefore, the load of the passivation layer 24 is dispersed to the stress-absorbing layer 22. This prevents the opposite electrode 20 from being broken due to stress.

The sixth embodiment exemplarily shows a configuration in which the light-emitting function layer 18 is common to all the light-emitting elements U. However, as in the fifth embodiment, the light-emitting function layer 18 may be independently formed for each emission color of the light-emitting elements U.

G: Seventh Embodiment

Figure 24:
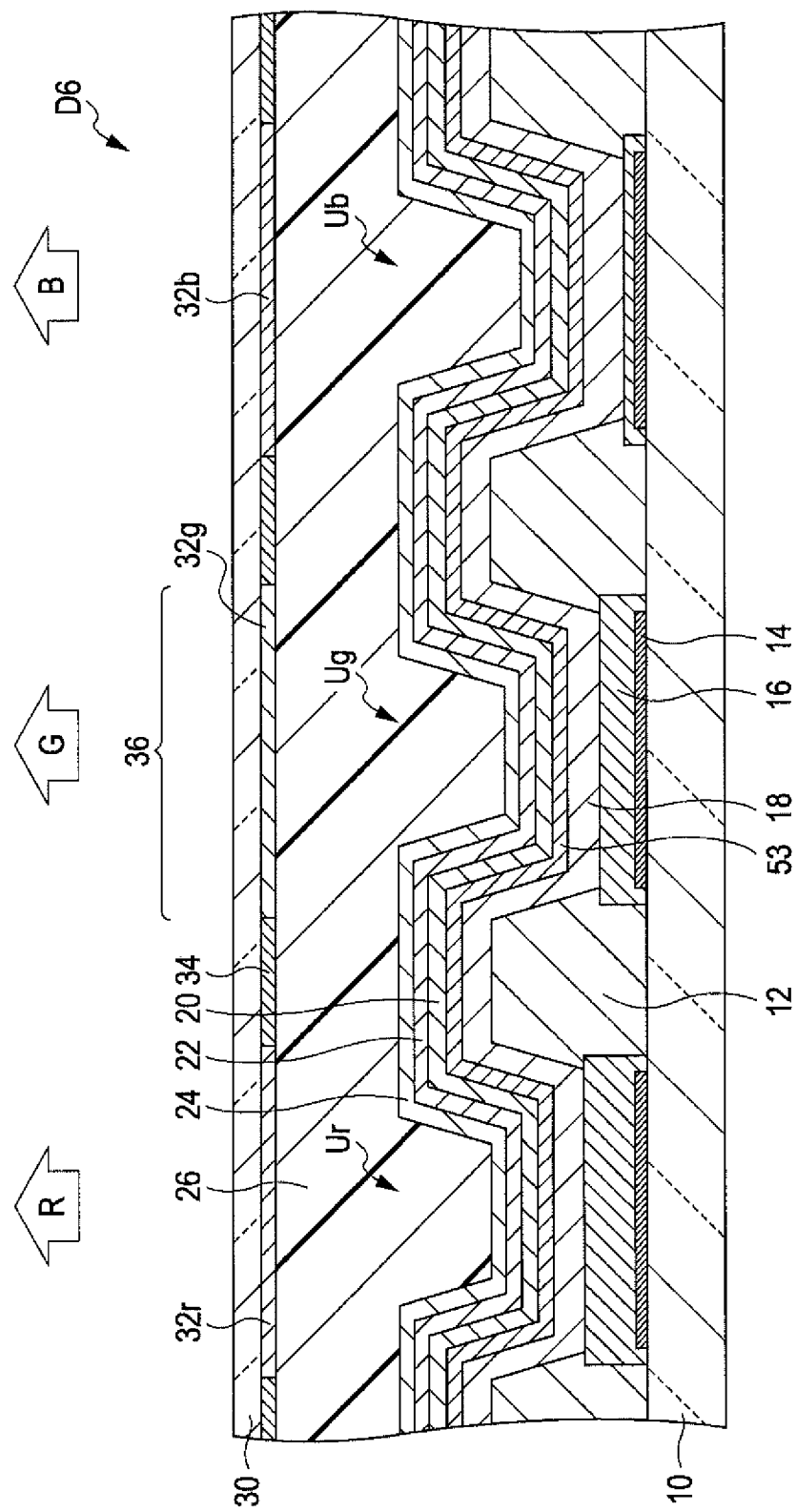
FIG. 24 is a cross-sectional view illustrating a structure of a light-emitting device according to a seventh embodiment.

FIG. 24 is a cross-sectional view illustrating a structure of a light-emitting device D6 according to a seventh embodiment of the invention. In the seventh embodiment, a mixture layer 53 made of a mixture of an electron-injecting material and a reducible metal material for reducing the electron-injecting material is disposed on the light-emitting function layer 18, and the opposite electrode 20 is disposed on the mixture layer 53. The configuration in the seventh embodiment is different from that of the sixth embodiment in the above points, but since the other configuration is the same as that of the sixth embodiment, the description thereof is omitted. In the seventh embodiment, the electron-injecting material is LiF, and the reducible metal material is Al.

The Ag atoms forming the opposite electrode 20 can be also prevented from aggregating with one another into islands (breakage of the film) by using the mixture layer 53 made of a mixture of an electron-injecting material and a reducible metal material as a base of the opposite electrode 20, as in the seventh embodiment. Since the material of the opposite electrode 20 is different from that of the passivation layer 24 disposed thereon, their physical constants, such as a thermal expansion coefficient, are different. Therefore, stress is generated between these layers. In particular, the stress increases with the ratio of Ag and causes peeling of the opposite electrode 20.

In also the seventh embodiment, as in the sixth embodiment, the opposite electrode 20 is covered by a stress-absorbing layer 22, and a passivation layer 24 is formed on the stress-absorbing layer 22. Therefore, the load of the passivation layer 24 is dispersed to the stress-absorbing layer 22. This can prevent the opposite electrode 20 from being broken due to stress.

The seventh embodiment exemplarily shows a configuration in which the light-emitting function layer 18 is common to all the light-emitting elements U. However, as in the fifth embodiment, the light-emitting function layer 18 may be independently formed for each emission color of the light-emitting elements U.

H: Eighth Embodiment

Figure 25:
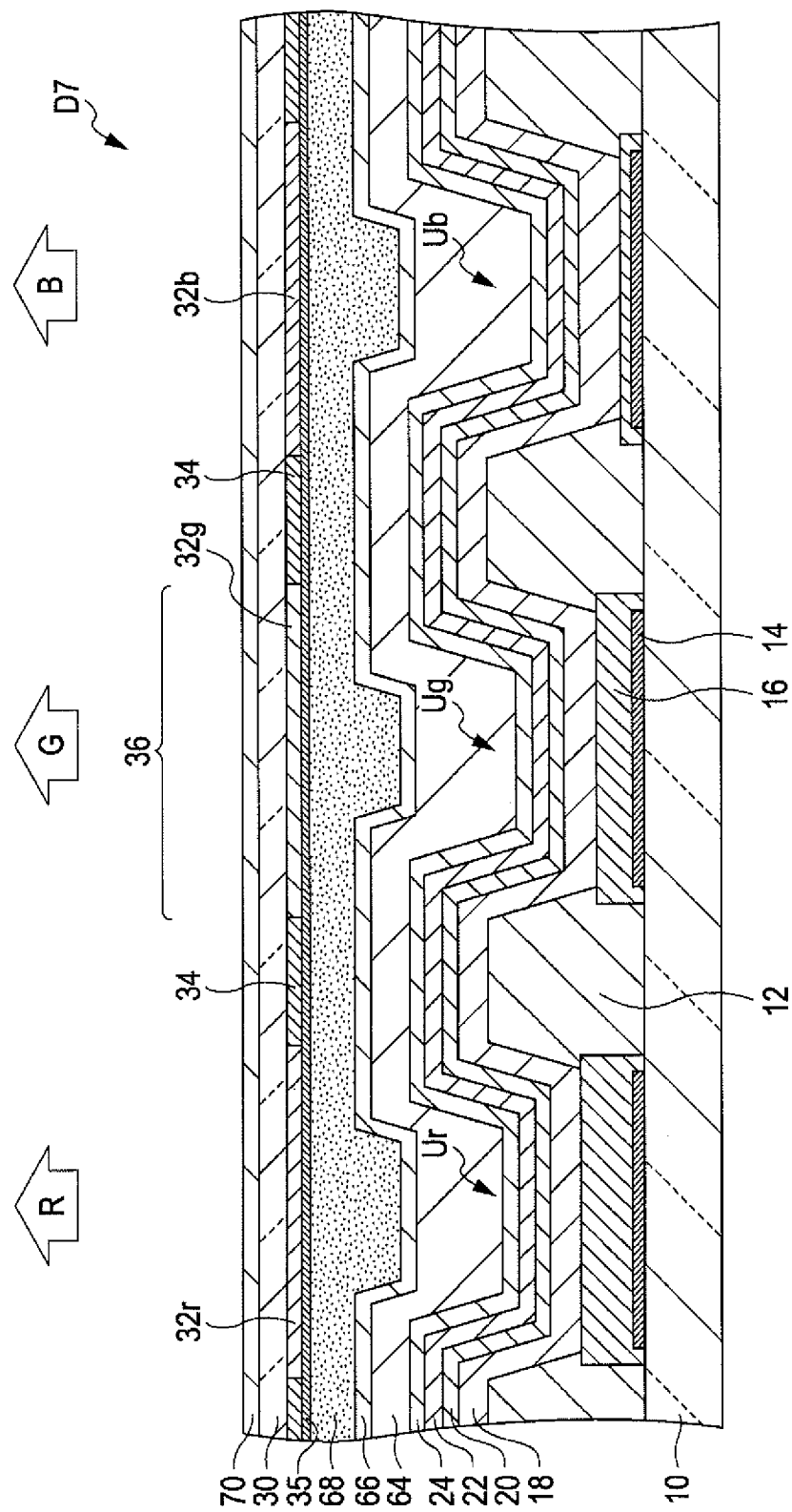
FIG. 25 is a cross-sectional view illustrating a structure of a light-emitting device according to an eighth embodiment.

FIG. 25 is a cross-sectional view illustrating a structure of a light-emitting device D7 according to an eighth embodiment of the invention. The light-emitting device D7 according to the eighth embodiment has a configuration similar to that of the light-emitting device D3 according to the fourth embodiment. That is, the light-emitting device D7 is a top emission type light-emitting device having three kinds of light-emitting elements U (Ur, Ug, and Ub) arrayed on a surface of a first substrate 10. The light-emitting element Ur emits red light, the light-emitting element Ug emits green light, and the light-emitting element Ub emits blue light. The light-emitting elements U each have a structure in which a light-reflecting layer 14, a pixel electrode 16, a light-emitting function layer 18, and an opposite electrode 20 are laminated on the first substrate 10.

The three kinds of the light-emitting elements U (Ur, Ug, and Ub) are provided with a common light-emitting function layer 18. The color of emitted light is determined by an effect of enhancing light of a specific wavelength range by resonance between the light-reflecting layer 14 and the opposite electrode 20 and an effect of coloring by color filters 32 (32r, 32g, or 32b). Since the other configuration is the same as that of the light-emitting device D3 according to the fourth embodiment, the description thereof is omitted.

The light-emitting device D7 according to the eighth embodiment is slightly different from the light-emitting devices D (D3, D4, D5, and D6) according to the above-described embodiments in the sealing layer thereof. The sealing layer in the eighth embodiments is configured of an organic buffer layer 64, a gas barrier layer 66, and a transparent adhesion layer 68. However, such a configuration can be also applied to the light-emitting devices D (D3, D4, D5, and D6) according to the above-described embodiments.

The gas barrier layer 66 is a layer for preventing infiltration of water and the like from the exterior, as the passivation layer 24, and is made of SiO (silicon oxide) and has a thickness of 200 to 400 nm. The organic buffer layer 64 is made of an epoxy resin (or an acrylic resin or the like) and flattens unevenness due to the wall 12 and other components. The transparent adhesion layer 68 is made of an epoxy resin and bonds the first substrate 10 and the second substrate 30.

Furthermore, the second substrate 30 of the light-emitting device D7 according to the eighth embodiment is provided with an over coat layer 35 on the side of the color filters 32 for protecting the color filters 32 and is provided with a circularly polarizing plate 70 on the other side. The circularly polarizing plate 70 inhibits a decrease in display quality due to reflection by the light-reflecting layer 14 or the like by using a property that the direction of rotation of polarization is reversed. Both of the two components can be also applied to the light-emitting devices D (D3, D4, D5, and D6) according to the above-described embodiments.

Furthermore, in the light-emitting device D7 according to the eighth embodiment, the electron-injection layer, the uppermost layer of the light-emitting function layer 18, is made of LiF and has a 1 nm thickness. The electron-injection layer may be made of, for example, $Li_2O$, MgO, or $CaF_2$, as well as LiF, as a film having a thickness of 0.5 to 2 nm, preferably 1 nm. In addition, a layer made of Liq (lithium quinolate) and having a thickness of 1 to 20 nm can have both functions of the electron-injection layer and the electron-transporting layer.

Furthermore, the opposite electrode 20 of the light-emitting device D7 according to the eighth embodiment is made of MgAg (magnesium-silver alloy) as in the light-emitting device D3 according to the fourth embodiment. The mixture ratio is Mg:Ag=1:20, and the thickness is 10 nm. Ag has high reflectivity and electrical conductivity and is therefore suitable as a material of the second electrode. However, in the case that a thin film with a 30 nm thickness or less is formed by deposition, the film is not even and has rough film quality, resulting in a decrease in the reflectivity and electrical conductivity. A film made of a mixture of Ag and another metal can be even and can be simultaneously enhanced in the electrical conductivity.

The opposite electrode 20 may be made of an alloy of Ag with a metal other than Mg or a laminate of such alloys. Specifically, an alloy of Ag with Cu, Zn, Pd, Nd, or Al can be used. In addition, a laminate of such alloys, for example, a laminate of AgCu and AgPd can be used.

The light-emitting device D7 according to the eighth embodiment is largely different from the light-emitting devices D3, D4, D5, and D6 in the material forming the stress-absorbing layer 22. That is, the stress-absorbing layer 22 of the light-emitting device D7 according to the eighth embodiment is made of a metal, other than Ag, having a work function of 4.2 eV or more, or a dielectric, such as Zn, Al, Au, $SnO_2$, $ZnO_2$, or SiO. The reasons thereof will be described below.

The stress-absorbing layer 22 is formed for absorbing stress to the opposite electrode 20 during the formation of the passivation layer 24. In addition, degradation of Ag (blackening by oxidation and opacification) contained in the opposite electrode 20 is inhibited by $O_2$ plasma applied before the formation of the passivation layer 24. Therefore, the material of the stress-absorbing layer 22 in each of the light-emitting devices (D3, D4, D5, and D6) according to the fourth to seventh embodiments is determined such that the material is softer than those of the opposite electrode 20 and the passivation layer 24. In addition, the stress-absorbing layer 22 is required to have light transmittance and moisture resistance.

However, subsequent experiments have revealed that in the case of the stress-absorbing layer 22 is made of a material having a work function of less than 4.2 eV (electron volt), the light-emitting element U slightly emits light during black display as a light-emitting device D, resulting in a reduction in contrast. Furthermore, additional experiments have revealed that the light emission (during black display) can be inhibited by forming the stress-absorbing layer 22 with a material having a work function of 4.2 eV (electron volt) or more. In the light-emitting device D7 according to the eighth embodiment, on the basis of such experimental results, the stress-absorbing layer 22 is made of Zn (zinc). Specifically, the stress-absorbing layer 22 is formed by depositing Zn so as to have a thickness of 3 nm. By using such a material, the light-emitting device D7 according to the eighth embodiment can have an opposite electrode 20 having favorable electrical conductivity and transparency as in the light-emitting devices (D3, D4, D5, and D6) according to the fourth to seventh embodiments and can reduce the light emission during black display, resulting in enhancement of contrast.

Figure 27:
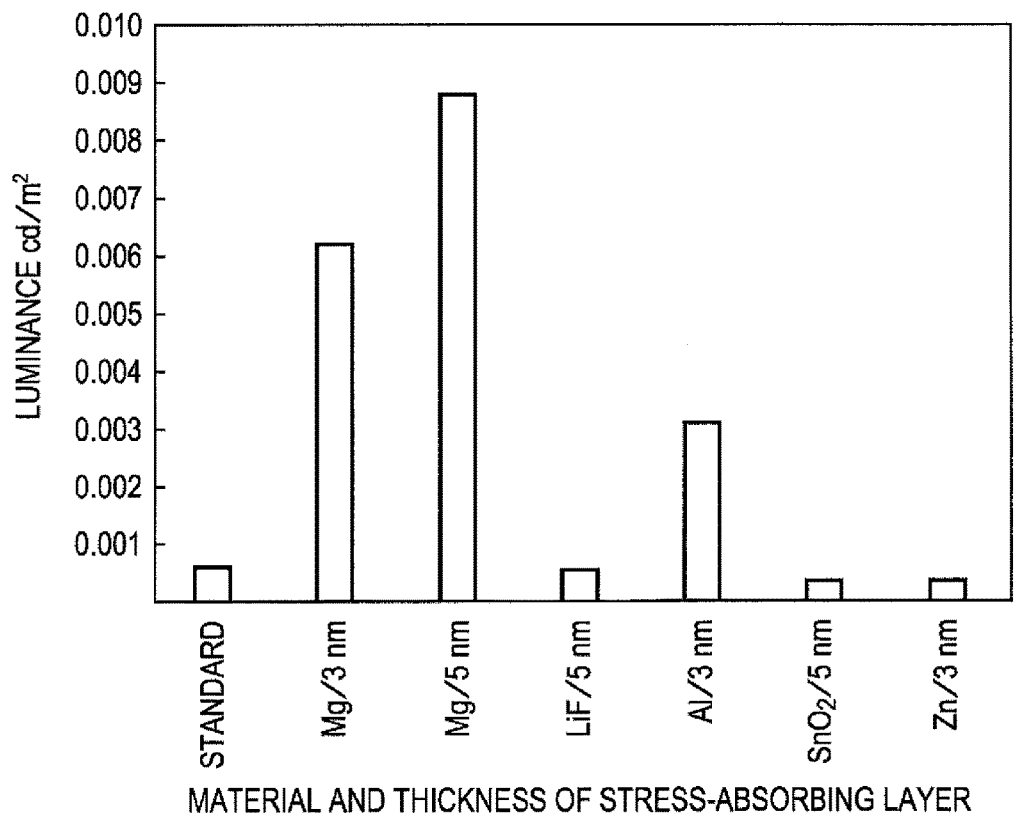
FIG. 27 is a graph showing luminance at low current operation of the light-emitting device according to the eighth embodiment.

FIG. 27 is a graph showing light emission during black display, that is, luminance at low current operation of the light-emitting device D7 according to the eighth embodiment. Specifically, luminance (cd/m$^2$) when a current of 0.00033 mA/cm$^2$ is applied is shown on the vertical axis. Hereinafter, the luminance in such a low current operation is simply referred to as "luminance". Lower luminance can achieve higher contrast of the light-emitting device. Furthermore, as a comparison, the luminance of a light-emitting device having the same components as those of the light-emitting device D7 except that the stress-absorbing layer 22 is made of a material other than Zn is shown. On the horizontal axis, the material and the thickness of each stress-absorbing layer 22 are shown. As shown in the drawing, the measurement result of the light-emitting device D7 according to the eighth embodiment, that is, the measurement result of the stress-absorbing layer 22 made of Zn and having a 3 nm thickness is shown at the right of the graph.

In the light-emitting devices used for the measurement of luminance, except the "standard" light-emitting device shown at the left of the graph as a reference, the electron-injection layer is made of LiF and has a 1 nm thickness, and the opposite electrode 20 is made of MgAg (1:20). In the "standard" light-emitting device, the electron-injection layer is made of LiF and has a 1 nm thickness, and the opposite electrode 20 is made of MgAg (10:1). In such a combination of the electron-injection layer and the opposite electrode 20 (of the "standard" light-emitting device), since the light-extracting efficiency is low, despite the low luminance, it is inadequate to a top-emission-type light-emitting device. Accordingly, in the light-emitting devices D (D3, D4, D5, D6, and D7) according to the embodiments of the invention, the opposite electrode 20 is made of only Ag or a material whose main component is Ag.

The luminance of the light-emitting device D7 according to the eighth embodiment is 0.00033 cd/m$^2$. The luminance of a light-emitting device including a stress-absorbing layer 22 made of SnO$_2$ (tin oxide) and having a 5 nm thickness is 0.00032 cd/m$^2$, and therefore such a light-emitting device is further excellent. On the other hand, the luminance of a light-emitting device including a stress-absorbing layer 22 made of Al and having a 3 nm thickness is 0.00312 cd/m$^2$, which is about ten times that of the stress-absorbing layer 22 made of Zn or SnO$_2$. Here, regarding the work function of each of the above-mentioned materials, Zn has of 4.9 eV, SnO$_2$ has of 5.0 eV, and Al has of 4.2 eV. Therefore, it is confirmed that it is preferable to form the stress-absorbing layer 22 with a material having a work function of 4.2 eV or more.

Luminance in the case of a LiF layer having a 5 nm thickness is 0.00053 cd/m$^2$. It is believed that since the work function of LiF is large, 5.0 eV, whereas that of Li (lithium) itself is low, the luminance is thus low. In addition, it is believed that favorable results can be obtained in cases of using another material, for example, Au (with a work function of 4.8 eV) or SiO (with a work function of 5.0 eV). On the other hand, luminance in the case of using only Mg is further higher than that in the case of using Al. This reveals that Mg is unfavorable as the material of the stress-absorbing layer 22. However, in the case of using Mg as a compound with another material such as MgO or MgF$_2$, not as only Mg, the above is not applied.

Thus, in the light-emitting device D7 according to the eighth embodiment, as in the light-emitting devices D3, D4, D5, and D6 according to the fourth to seventh embodiments, the opposite electrode 20 exhibiting enhanced light-extracting efficiency during light emission is obtained by providing the stress-absorbing layer 22 between the opposite electrode 20 and the passivation layer 24. Furthermore, light emission during black display is reduced by forming the stress-absorbing layer 22 with Zn, which has a work function of 4.9 eV, resulting in enhancement of contrast. Therefore, the display quality is further increased.

I: Ninth Embodiment

Figure 26:
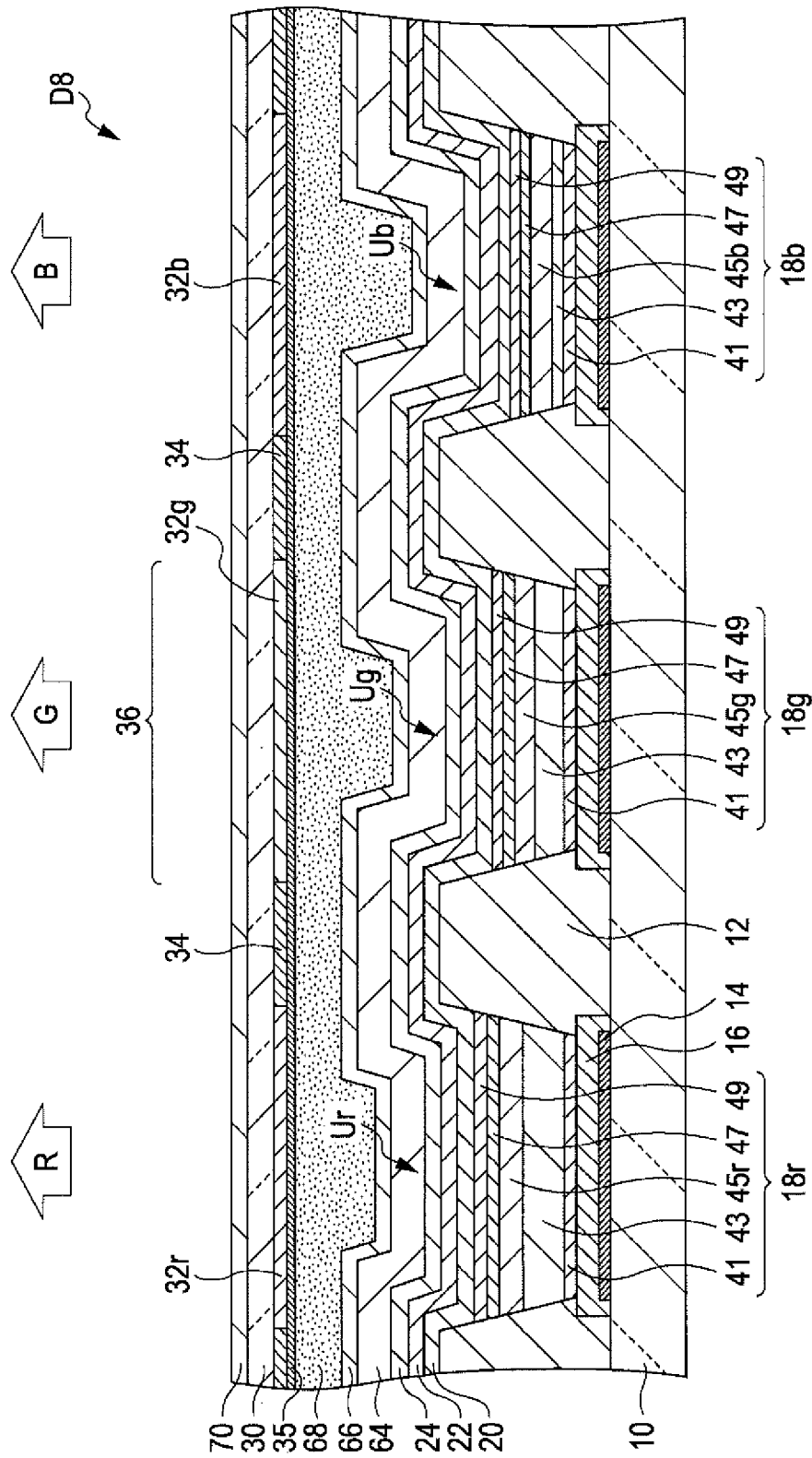
FIG. 26 is a cross-sectional view illustrating a structure of a light-emitting device according to a ninth embodiment.

FIG. 26 is a cross-sectional view illustrating a structure of a light-emitting device D8 according to a ninth embodiment of the invention. In the eighth embodiment, the light-emitting function layer 18 is common to all the light-emitting elements U, but in the light-emitting device D8 according to the ninth embodiment, as in the light-emitting device D4 according to the fifth embodiment, the light-emitting function layer 18 is independently formed for each emission color of the light-emitting elements U.

That is, as shown in FIG. 26, the light-emitting function layers 18 (18r, 18g, and 18b) are each composed of a hole-injection layer 41 disposed on the pixel electrode 16, a hole-transporting layer 43 disposed on the hole-injection layer 41, a light-emitting layer 45 (45r, 45g, or 45b) disposed on the hole-transporting layer 43, an electron-transporting layer 47 disposed on the light-emitting layer 45, and an electron-injection layer 49 disposed on the electron-transporting layer 47.

The light-emitting function layer 18r of the light-emitting element Ur contains the light-emitting layer 45r made of an organic EL material that generates light of an R (red) wavelength range. The light-emitting function layer 18g of the light-emitting element Ug contains the light-emitting layer 45g made of an organic EL material that generates light of a G (green) wavelength range. The light-emitting function layer 18b of the light-emitting element Ub contains the light-emitting layer 45b made of an organic EL material that generates light of a B (blue) wavelength range.

In addition, as in the light-emitting device D4, in the light-emitting device D8 according to the ninth embodiment, the thicknesses of the hole-transporting layers 43 are controlled such that the color of light emitted by each of the light-emitting elements U (Ur, Ug, and Ub) is enhanced. The configurations of other components are the same as those of the light-emitting device D7 according to the eighth embodiment. That is, the stress-absorbing layer 22 is made of Zn and has a 3 nm thickness. Therefore, a description of each component is omitted.

In the light-emitting device D8 according to the ninth embodiment, as in the light-emitting device D7 according to the eighth embodiment, an opposite electrode 20 exhibiting enhanced light-extracting efficiency during light emission is obtained by providing a stress-absorbing layer 22 between the opposite electrode 20 and the passivation layer 24. Furthermore, light emission during black display is reduced by forming the stress-absorbing layer 22 with Zn, which has a work function of 4.9 eV, resulting in enhancement of contrast. Therefore, the display quality is further increased.

J: Tenth Embodiment

Figure 28:
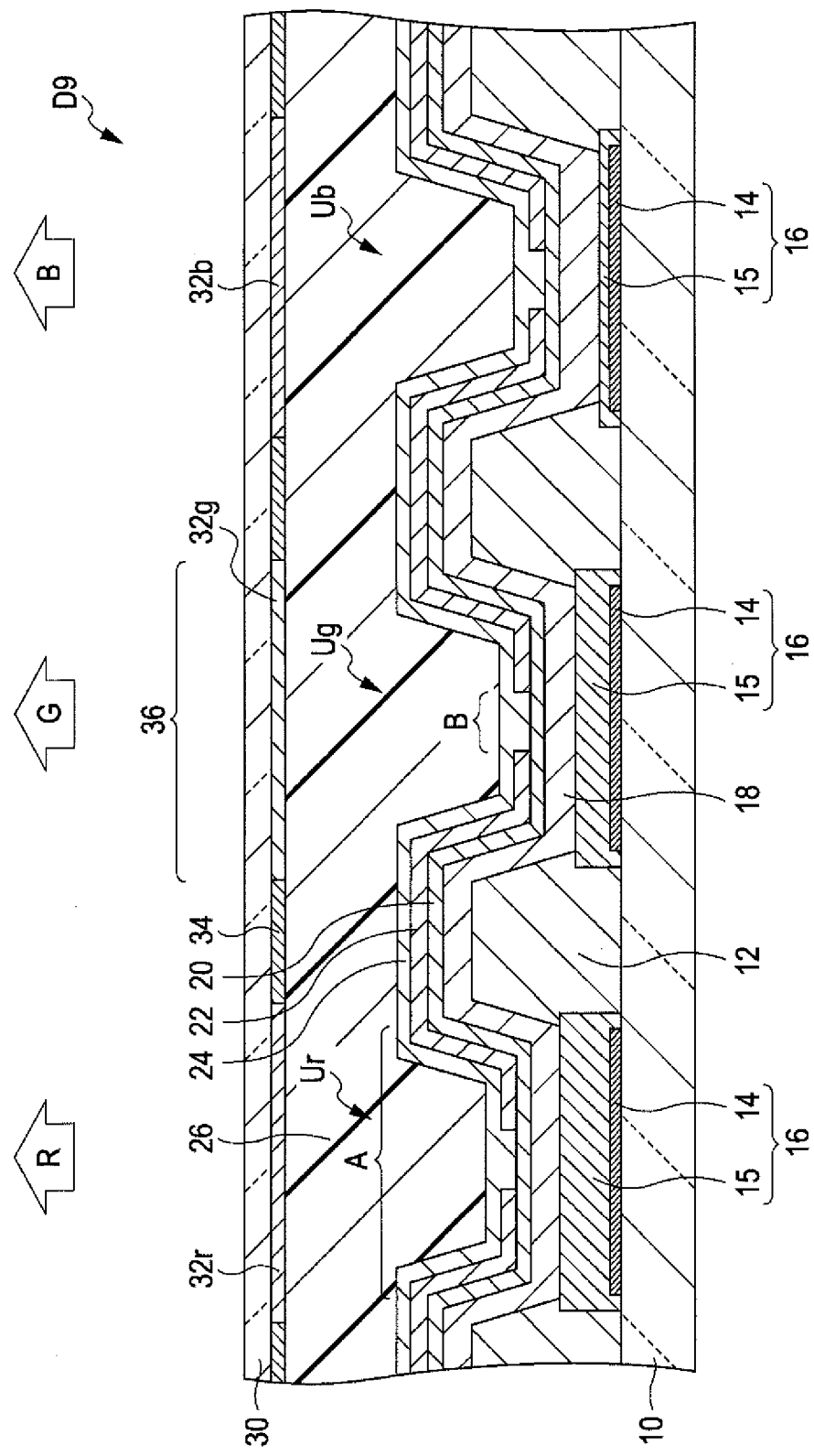
FIG. 28 is a cross-sectional view illustrating a structure of a light-emitting device according to a tenth embodiment.
Figure 29:
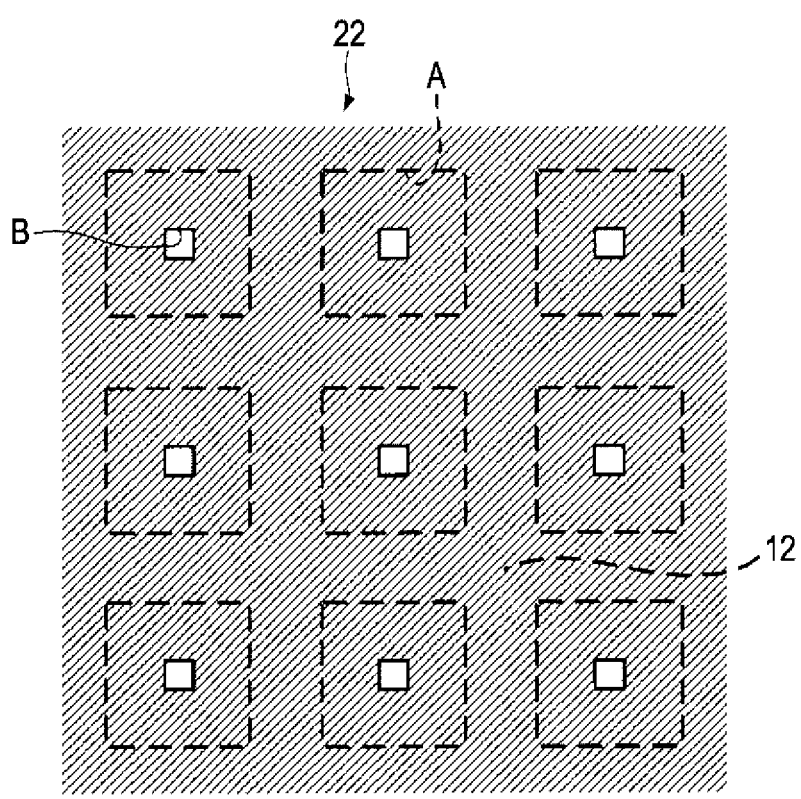
FIG. 29 is a plan view illustrating the structure of the light-emitting device according to the tenth embodiment.

FIG. 28 is a cross-sectional view illustrating a structure of a light-emitting device D9 according to a tenth embodiment of the invention, and FIG. 29 is a plan view of the light-emitting device D9.

As shown in FIG. 28, the light-emitting device D9 has a configuration in which a plurality of light-emitting elements U (Ur, Ug, and Ub) is arrayed on a surface of a first substrate 10. Each light-emitting element U is an element generating light with a wavelength corresponding to any of a plurality of colors (red, green, and blue). In the tenth embodiment, the light-emitting element Ur emits red light, the light-emitting element Ug emits green light, and the light-emitting element Ub emits blue light. The light-emitting device D9 according to the tenth embodiment is a top emission type in which light generated by each light-emitting element U is emitted toward the opposite side with respect to the first substrate 10. Therefore, the first substrate 10 may be made of an opaque plate-like material such as a ceramic or metal sheet, as well as a light-transmissive plate-like material such as glass. The first substrate 10 is provided with wiring (not shown) for feeding power to the light-emitting elements U to emit light. Furthermore, the first substrate 10 is provided with circuits (not shown) for feeding power to the light-emitting elements U.

On the first substrate 10, a wall 12 (separator) is provided. As shown in FIG. 29, the wall 12 is provided with openings A at positions corresponding to the light-emitting elements U and is thereby formed in a grid pattern. The wall 12 is made of a transparent insulative material such as acryl or polyimide. As described below, the plurality of light-emitting elements U is separated by the grid patterned wall 12 and is thereby arrayed in a matrix form.

As shown in FIG. 28, each of the plurality of light-emitting elements U includes a pixel electrode 16, a light-emitting function layer 18, and an opposite electrode 20. Furthermore, the light-emitting device D9 according to the tenth embodiment and the below-described light-emitting device D10 according to an eleventh embodiment have a configuration in which the pixel electrode 16 includes a light-reflecting layer 14. That is, the pixel electrode 16 is configured of the light-reflecting layer 14 disposed on a first substrate 10 and a transparent electrode 15 covering the light-reflecting layer 14. The pixel electrodes 16 are disposed on the first substrate 10 and are surrounded by the wall 12 in a plan view.

The light-reflecting layers 14 are made of a metal material having high reflectance, for example, a simple metal, such as aluminum or silver, or an alloy whose main component is aluminum or silver. In the tenth embodiment, the light-reflecting layers 14 are made of a silver alloy available from Furuya Metal Co., Ltd. under the trade name "APC" and have an 80 nm thickness. The transparent electrodes 15 are made of a transparent, electrically conductive oxide material, such as ITO, IZO, or $ZnO_2$. In the tenth embodiment, the transparent electrodes 15 are made of ITO and have different thicknesses that correspond to the respective emission colors of the light-emitting elements U. The details thereof will be described below.

The light-emitting function layer 18 is formed so as to cover each of the transparent electrodes 15 and the wall 12. That is, the light-emitting function layer 18 continues over the plurality of light-emitting elements U, and the characteristics of the light-emitting function layer 18 are equally applied to the plurality of light-emitting elements U. Though the details are not shown in the drawing, the light-emitting function layer 18 is composed of a hole-injection layer disposed on the transparent electrodes 15, a hole-transporting layer disposed on the hole-injection layer, a light-emitting layer disposed on the hole-transporting layer, an electron-transporting layer disposed on the light-emitting layer, and an electron-injection layer disposed on the electron-transporting layer.

In the tenth embodiment, the hole-injection layer is made of "HI-406", the trade name of Idemitsu Kosan Co., Ltd., and has a 40 nm thickness. The hole-transporting layer is made of "HT-320", the trade name of Idemitsu Kosan Co., Ltd., and has a 15 nm thickness. The hole-injection layer and the hole-transporting layer may be formed of a single layer having both functions of the hole-injection layer and the hole-transporting layer.

The light-emitting layer is made of an organic EL material that emits light by recombining holes and electrons. In the tenth embodiment, the organic EL material is a low molecular material and emits white light. The host material of the light-emitting layer is "BH-232", the trade name of Idemitsu Kosan Co., Ltd., and red, green, and blue dopants are mixed with the host material. In the tenth embodiment, "RD-001", "GD-206", and "BD-102", the trade names of Idemitsu Kosan Co., Ltd., are used as the red, green, and blue dopants, respectively. In the tenth embodiment, the thickness of the light-emitting layer is 65 nm.

In the tenth embodiment, the electron-transporting layer is made of Alq3 (tris(8-quinolinolato)aluminum complex) and has a 10 nm thickness. The electron-injection layer is made of LiF (lithium fluoride) and has a 1 nm thickness. The electron-transporting layer and the electron-injection layer may be formed of a single layer having both functions of the electron-injection layer and the electron-transporting layer.

The opposite electrode 20 is a cathode and is formed so as to cover the light-emitting function layer 18. That is, the opposite electrode 20 continues over the plurality of light-emitting elements U. The opposite electrode 20 functions as a semi-transparent reflective layer having a property that part of light reaching the surface thereof is transmitted and the remaining light is reflected (i.e., semi-transparent reflectivity) and is formed of, for example, a single metal, such as magnesium or silver, or an alloy whose main component is magnesium or silver. In the tenth embodiment, the opposite electrode 20 is made of a magnesium-silver alloy (MgAg) and has a 10 nm thickness.

The light-emitting function layer 18 and the opposite electrode 20 are common to the plurality of light-emitting elements U. However, since the individual pixel electrodes 16 are separated from one another, when current flows between any of the pixel electrodes 16 and the opposite electrode 20, the light-emitting function layer 18 emits light only at a position where the light-emitting function layer 18 overlaps that pixel electrode 16. That is, the wall 12 separates the plurality of light-emitting elements U, and a region surrounded by the wall 12, namely, the region of the pixel electrode 16 can be called a zone of the light-emitting element U.

In each light-emitting element U, a resonator structure that resonates light emitted by the light-emitting function layer 18 is formed between the light-reflecting layer 14 and the opposite electrode 20. That is, the light emitted by the light-emitting function layer 18 goes and returns between the light-reflecting layer 14 and the opposite electrode 20, and light with a specific wavelength is enhanced by resonance and passes through the opposite electrode 20 to be emitted toward the observer side (upside in FIG. 28) (top emission).

The thicknesses of the transparent electrodes 15 in the light-emitting elements U are controlled such that red color in the white light emitted by the light-emitting function layer 18 is enhanced in the light-emitting element Ur, green color is enhanced in the light-emitting element Ug, and blue color is enhanced in the light-emitting element Ub. More specifically, in the tenth embodiment, the transparent electrode 15 of the light-emitting element Ur has a 110 nm thickness, the transparent electrode 15 of the light-emitting element Ug has a 70 nm thickness, and the transparent electrode 15 of the light-emitting element Ub has a 27 nm thickness.

As shown in FIG. 28, a stress-absorbing layer 22 is partially disposed on the opposite electrode 20 for easing the concentration of stress to the opposite electrode 20. The stress-absorbing layer 22 has light transmittance and moisture resistance and is made of a material that is softer than those of the opposite electrode 20 and the below-described passivation layer 24. Preferred examples of the material of the stress-absorbing layer 22 include lithium fluoride (LiF), lithium oxide ($LiO_2$), sodium fluoride (NaF), calcium fluoride ($CaF_2$), calcium oxide (CaO), magnesium fluoride ($MgF_2$), magnesium oxide (MgO), and polytetrafluoroethylene. In the tenth embodiment, the stress-absorbing layer 22 is made of lithium fluoride (LiF), which is the same material as that of the electron-injection layer, and has a 45 nm thickness.

In the tenth embodiment, the stress-absorbing layer 22 covers the opposite electrode 20 at at least part of a region where the opposite electrode 20 overlaps the wall 12, but does not cover the opposite electrode 20 at at least part a region where the opposite electrode 20 overlaps the light-emitting function layer 18 in the zone of a light-emitting element U separated by the wall 12. More specifically, the configuration is as follows. In FIG. 29, the shaded portion is the stress-absorbing layer 22. As shown in FIG. 29, the stress-absorbing layer 22 is provided with a plurality of openings B that correspond to the respective zones (regions surrounded by the openings A) of the light-emitting elements U separated by the wall 12.

As shown in FIG. 29, each opening B is located at a central area of the zone of each light-emitting element U separated by the wall 12 [(the opening space of the opening B)<(the opening space of the opening A)]. That is, the stress-absorbing layer 22 covers the opposite electrode 20 at a region where the opposite electrode 20 overlaps the wall 12 and at a region in the zone (including the peripheral region) of each light-emitting element U separated by the wall 12 other than the central area of the zone, but does not cover the opposite electrode 20 at the central area in the zone of each light-emitting element U separated by the wall 12. The regions of the opposite electrode 20 not being covered by the stress-absorbing layer 22 are the openings B in FIG. 29.

As shown in FIG. 28, a passivation layer 24 is disposed on the stress-absorbing layer 22. The passivation layer 24 is a protection layer for preventing infiltration of water and the air into the light-emitting elements U and is made of an inorganic material having a low gas transmittance, such as SiN (silicon nitride), SiON (silicon oxynitride), or SiO (silicon oxide). In the tenth embodiment, the passivation layer 24 is made of SiON and has a 225 nm thickness.

As shown in FIG. 28, in the tenth embodiment, a second substrate 30 is disposed so as to face the plurality of light-emitting elements U disposed on the first substrate 10. The second substrate 30 is made of a light transmissive material such as glass and is provided with color filters 32 and a light-shielding film 34 on the surface facing the first substrate 10. The light-shielding film 34 is a film having a light-shielding property and is provided with openings 36 at positions corresponding to the respective light-emitting elements U. The color filters 32 are disposed in the openings 36.

In the tenth embodiment, a red color filter 32r that selectively transmits red light is disposed in the opening 36 corresponding to the light-emitting element Ur, a green color filter 32g that selectively transmits green light is disposed in the opening 36 corresponding to the light-emitting element Ug, and a blue color filter 32b that selectively transmits blue light is disposed in the opening 36 corresponding to the light-emitting element Ub.

The second substrate 30 provided with the color filters 32 and the light-shielding film 34 is bonded to the first substrate 10 via a sealing layer 26. The sealing layer 26 is made of a transparent resin material, for example, a hardening resin such as an epoxy resin.

As described above, in the tenth embodiment, the stress-absorbing layer 22 partially covers the opposite electrode 20 for easing the concentration of stress to the opposite electrode 20. The stress-absorbing layer 22 is made of a material that is softer than those of the opposite electrode 20 and the passivation layer 24, and the load of the passivation layer 24 is dispersed to the stress-absorbing layer 22. Consequently, the opposite electrode 20 can be prevented from being broken due to the concentration of stress, compared to a configuration in which only the passivation layer 24 is disposed on the opposite electrode 20 without providing the stress-absorbing layer 22. Therefore, this has an advantage that a decrease in electrical conductivity of the light-emitting elements U can be inhibited.

Figure 30:
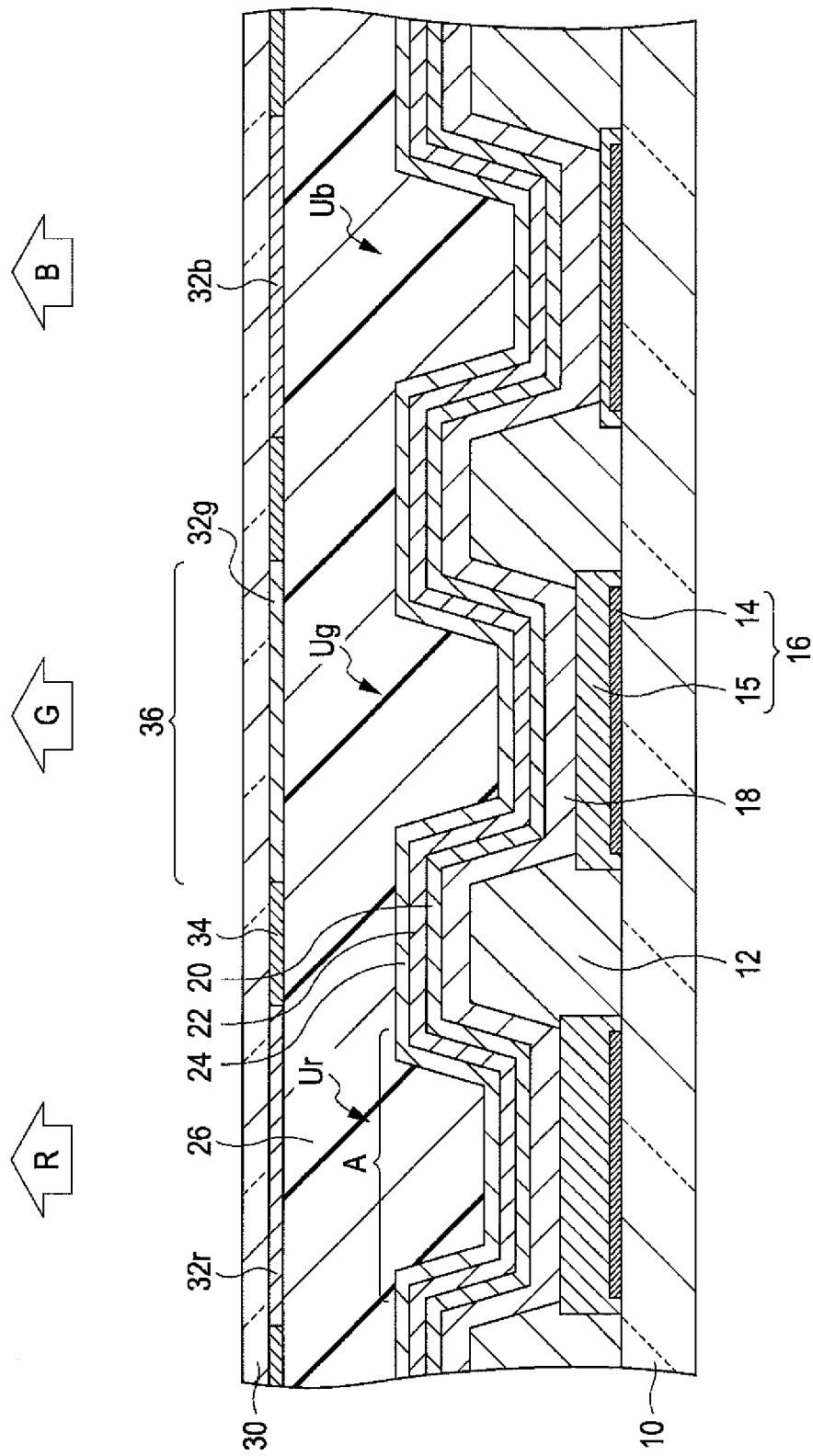
FIG. 30 is a cross-sectional view of a light-emitting device as a comparative example in which a stress-absorbing layer covers the entire second electrode.

FIG. 30 is a cross-sectional view of a light-emitting device (hereinafter, referred to as comparative example 1) having a configuration in which the entire opposite electrode 20 is covered by a stress-absorbing layer 22. In the comparative example 1, since the stress-absorbing layer 22 covers the opposite electrode 20 at a region where the opposite electrode 20 overlaps the light-emitting function layer 18 in the zone of each light-emitting element U separated by a wall 12, the amount of light passing through the opposite electrode 20 and the stress-absorbing layer 22 and traveling toward the observer side from the light-emitting function layer 18 is smaller than that in a configuration in which the stress-absorbing layer 22 does not cover the opposite electrode 20. Therefore, the amount of light emitted from the light-emitting device toward the observer side may be insufficiently ensured.

On the other hand, in the tenth embodiment, the stress-absorbing layer 22 on the opposite electrode 20 is provided with the plurality of openings B at positions that correspond to the central areas of the zones of the light-emitting elements U separated by the wall 12. Therefore, the loss of light emitted by the light-emitting function layer 18 and passing through the openings B is smaller than that of light passing through the stress-absorbing layer 22, and a greater amount of emission light can be extracted to the observer side, compared to the case in which the stress-absorbing layer 22 is formed over the entire opposite electrode 20.

Therefore, according to the tenth embodiment, there is an advantage that the amount of light emitted from the light-emitting device D9 toward the observer side can be ensured compared to that in comparative example 1.

Incidentally, when unevenness is formed between a region where the opposite electrode 20 overlaps the wall 12 and a region of the opposite electrode 20 in the zone of each light-emitting element U separated by the wall 12, asperities arising from the unevenness occur on the opposite electrode 20. In such a case, there is a high possibility that stress is excessively concentrated on the opposite electrode 20 at a region where the opposite electrode 20 overlaps the peripheral region of the zone of each light-emitting element U separated by the wall 12.

In the tenth embodiment, the stress-absorbing layer 22 covers the opposite electrode 20 at the peripheral region of the zone of each light-emitting element U separated by the wall 12. Therefore, according to the tenth embodiment, even if unevenness is formed between a region where the opposite electrode 20 overlaps the wall 12 and the peripheral region of the zone of each light-emitting element U separated by the wall 12, excessive concentration of stress to the opposite electrode 20 at the peripheral region of the zone of each light-emitting element U separated by the wall 12 can be inhibited. Consequently, the opposite electrode 20 can be prevented from being broken. In addition, in the tenth embodiment, the opposite electrode 20 is not covered by the stress-absorbing layer 22 at the central area of the zone of each light-emitting element U separated by the wall 12. Therefore, according to the tenth embodiment, there is an advantage that the amount of light emitted from the light-emitting device D9 toward the observer side can be ensured, while preventing the opposite electrode 20 from being broken by excessive concentration of stress to the opposite electrode 20.

K: Eleventh Embodiment

Figure 31:
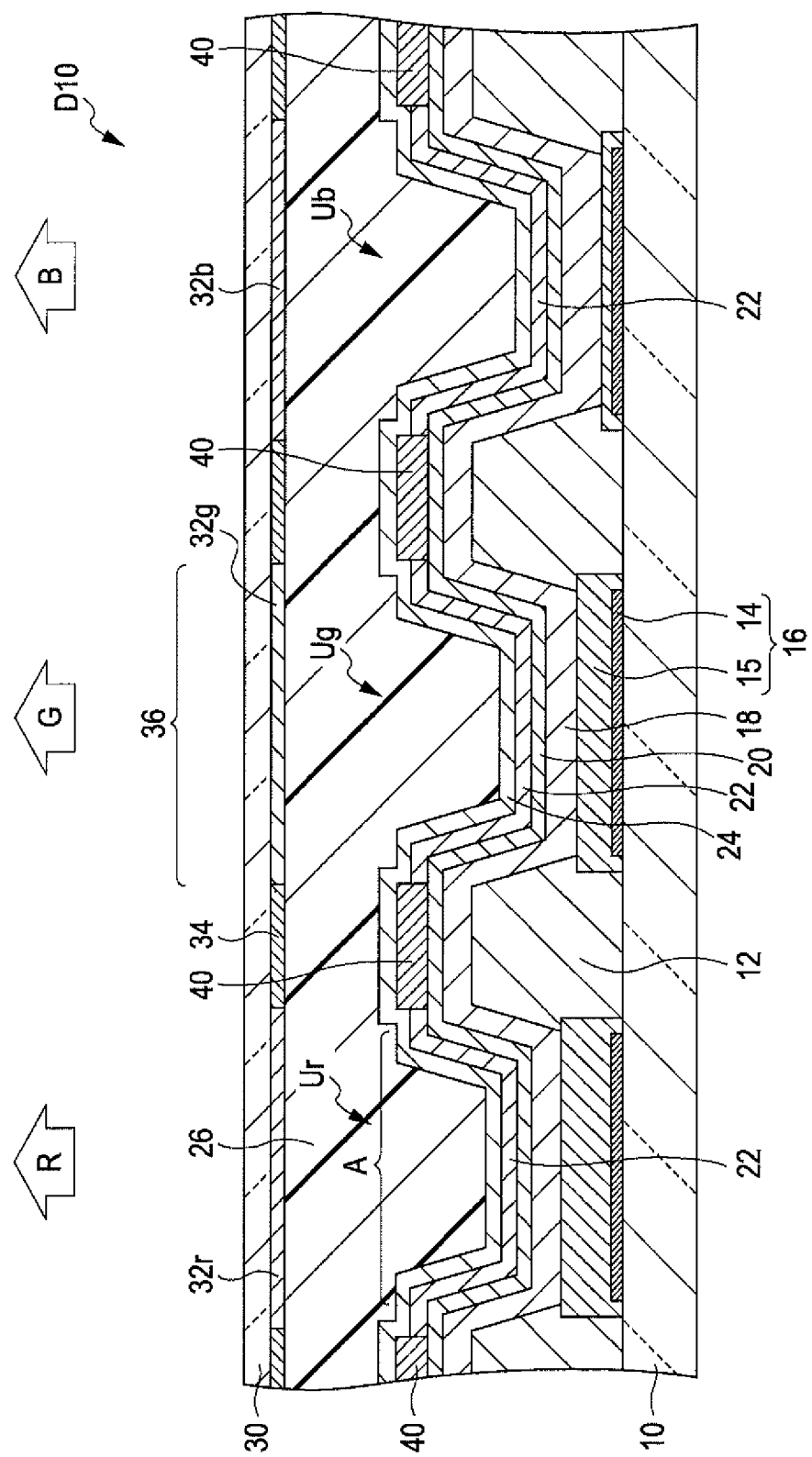
FIG. 31 is a cross-sectional view of a light-emitting device according to an eleventh embodiment.
Figure 32:
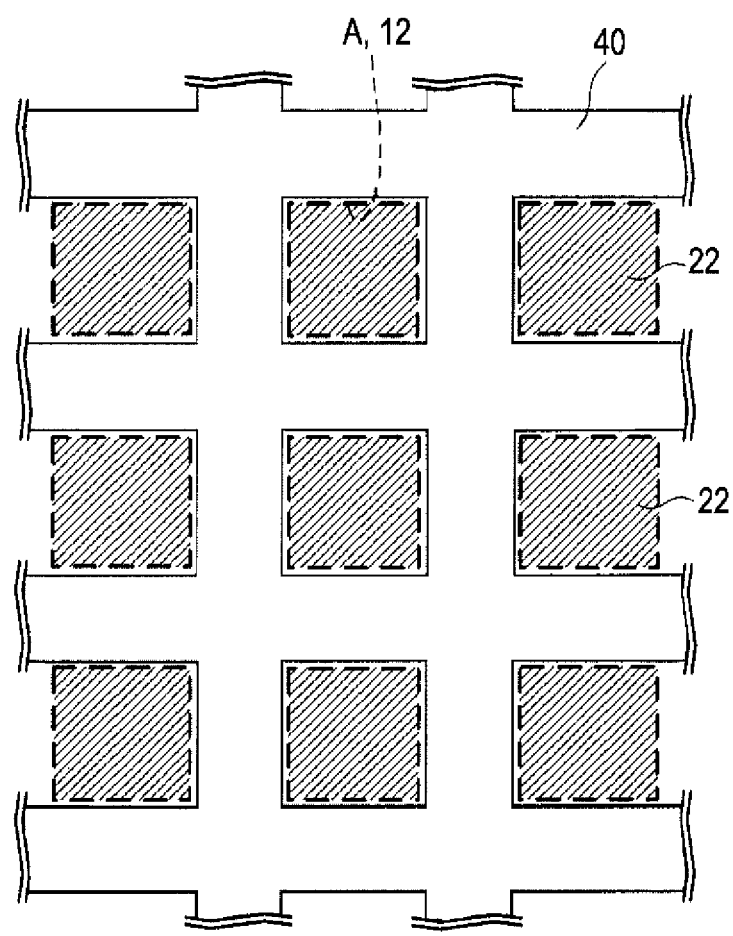
FIG. 32 is a plan view of the light-emitting device according to the eleventh embodiment.

FIG. 31 is a cross-sectional view of a light-emitting device D10 according to an eleventh embodiment of the invention. FIG. 32 is a plan view of the light-emitting device D10 according to the eleventh embodiment. In the light-emitting device D10 according to the eleventh embodiment, an auxiliary electrode 40 is disposed on the opposite electrode 20 for reducing the resistance of the opposite electrode 20. As shown in FIGS. 31 and 32, the auxiliary electrode 40 is formed in a grid pattern on the opposite electrode 20 at a region where the opposite electrode 20 overlaps the wall 12. The auxiliary electrode 40 is made of a metal material that is excellent in electrical conductivity, such as aluminum, gold, or silver.

In the light-emitting device D10 according to the eleventh embodiment, the stress-absorbing layer 22 completely covers the opposite electrode 20 at a region where the opposite electrode 20 overlaps the light-emitting function layer 18 in the zone of each light-emitting element U separated by the wall 12, but does not cover the auxiliary electrode 40. In these points, the light-emitting device D10 is different from the light-emitting device D9 according to the tenth embodiment. Since the other configuration is the same as that of the light-emitting device D9 of the tenth embodiment, the description thereof is omitted.

Figure 33:
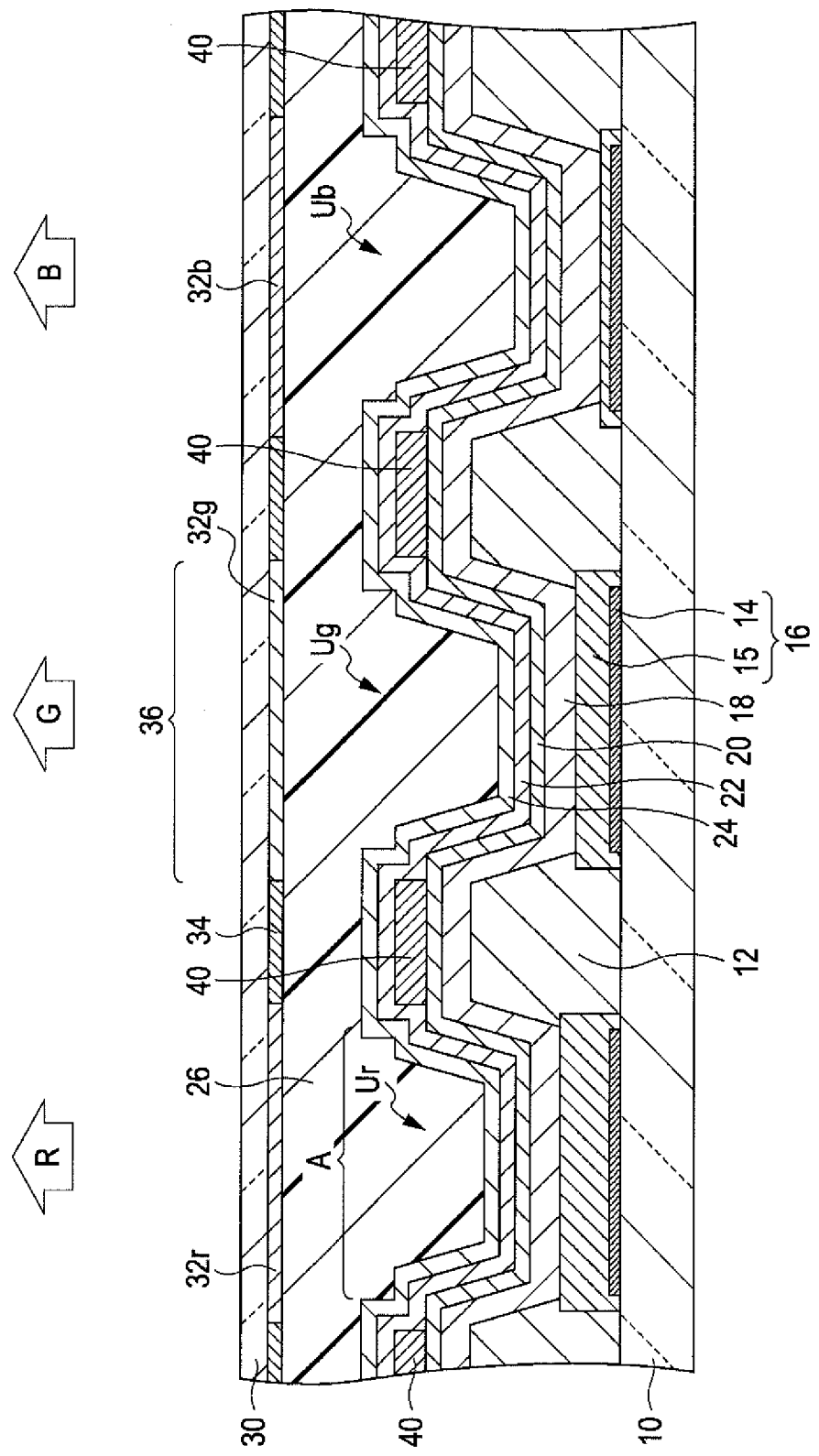
FIG. 33 is a cross-sectional view of a light-emitting device as a comparative example in which a stress-absorbing layer covers an auxiliary electrode.

FIG. 33 is a cross-sectional view of a light-emitting device (hereinafter, referred to as comparative example 2) having a configuration in which a stress-absorbing layer 22 covers an opposite electrode 20 in a region where the opposite electrode 20 overlaps a light-emitting function layer 18 in the zone of each light-emitting element U separated by a wall 12 and also covers an auxiliary electrode 40. The light-emitting device of the comparative example 2 is produced by a process including (1) depositing an opposite electrode 20 on the light-emitting function layer 18 in the zone of each light-emitting element U separated by the wall 12 and on the wall 12, inside a deposition chamber, (2) taking out the first substrate 10 deposited with the opposite electrode 20 from the deposition chamber and then forming an auxiliary electrode 40 on the opposite electrode 20 at a region where the opposite electrode 20 overlaps the wall 12, and (3) putting the first substrate 10 in the deposition chamber again and depositing a stress-absorbing layer 22 on the opposite electrode 20 at a region where the opposite electrode 20 overlaps the light-emitting function layer 18 in the zone of each light-emitting element U separated by the wall 12 and on the auxiliary electrode 40.

On the other hand, in the eleventh embodiment, the light-emitting device D10 is produced by a process including (1) depositing an opposite electrode 20 on a light-emitting function layer 18 in each zone separated by a wall 12 and on the wall 12, inside a deposition chamber, (2) subsequently, inside the deposition chamber, depositing a stress-absorbing layer 22 on the opposite electrode 20 at a region where the opposite electrode 20 overlaps the light-emitting function layer 18 in the zone of each light-emitting element U separated by the wall 12, and (3) taking out the first substrate 10 deposited with the opposite electrode 20 and the stress-absorbing layer 22 from the deposition chamber and then forming an auxiliary electrode 40 on the opposite electrode 20 at a region where the opposite electrode 20 overlaps the wall 12. That is, in the eleventh embodiment, since the opposite electrode 20 and the stress-absorbing layer 22 are formed by a continuous deposition process, there is an advantage that the manufacturing time is reduced, compared to the comparative example 2.

L: Modification

Embodiments of the invention are not limited to the above-described embodiments, and, for example, the following modifications are possible. In addition, a combination of two or more of the following modifications is possible.

(1) Modification 1

In the above-described embodiments, a low molecular material is used as the organic EL material forming the light-emitting layer of the light-emitting function layer 18. However, the organic EL material forming the light-emitting layer may be a high molecular material. In such a case, the light-emitting layer is formed by ink jetting or spin coating in the space separated by the wall 12, i.e., in the recess defined by the pixel electrode 16 as a bottom and the wall 12 as a side wall.

(2) Modification 2

In the light-emitting devices (D1 to D10) according to the above-described embodiments, color filters 32 are provided on the light-emitting side for raising the purity (color purity) of light to be emitted. However, the configuration is not limited to such a configuration, and, for example, the color filters 32 may not be provided.

Light with high purity can be emitted from each of the three kinds of light-emitting elements (Ur, Ug, and Ub), without using the color filters 32, by independently providing a light-emitting function layer 18 for each emission color of the light-emitting elements U, as in the light-emitting device D2 of the third embodiment shown in FIG. 12 or the light-emitting device D4 of the fifth embodiment shown in FIG. 22.

Figure 34:
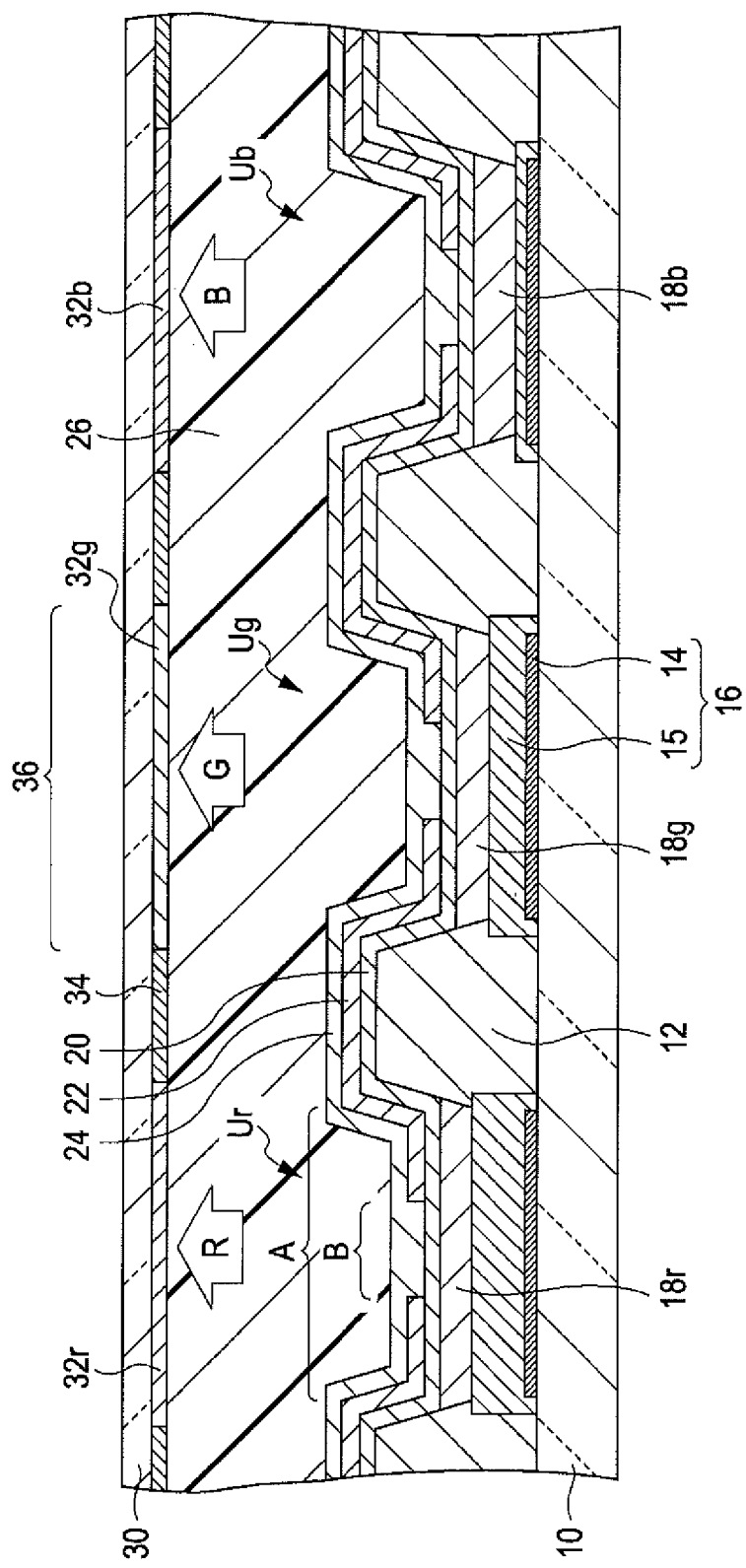
FIG. 34 is a cross-sectional view of a light-emitting device as a modification in which a light-emitting function layer is independently formed for each emission color.

FIG. 34 shows a light-emitting device of a modification. The light-emitting device has a configuration similar to that of the light-emitting device D9 according to the tenth embodiment, and the light-emitting function layer 18 is independently provided to each emission color of the light-emitting elements U. That is, the pixel electrodes 16 are each composed of a light-reflecting layer 14 disposed on a first substrate 10 and a transparent electrode 15 covering the light-reflecting layer 14. Furthermore, a light-emitting function layer 18r is formed in the light-emitting element Ur, a light-emitting function layer 18g is formed in the light-emitting element Ug, and a light-emitting function layer 18b is formed in the light-emitting element Ub. Each zone of the light-emitting elements U is also provided with an opening B. Therefore, light with high purity can be generated by each of the three kinds of light-emitting elements (Ur, Ug, and Ub), without using the color filters 32, and the light with high purity can be sufficiently emitted toward the observer side through the opening B.

(3) Modification 3

In each embodiment above, the opposite electrode 20 is a cathode of the light-emitting elements U, but may be an anode.

(4) Modification 4

In the light-emitting device D9 according to the tenth embodiment, the opposite electrode 20 is not covered by the stress-absorbing layer 22 at a region that corresponds to the central area of the zone of each light-emitting element U separated by the wall 12, but the configuration is not limited thereto. The opposite electrode 20 may not be covered by the stress-absorbing layer 22 at the entire area corresponding to the zone of each light-emitting element U.

In the light-emitting device D9 according to the tenth embodiment, the opposite electrode 20 is completely covered by the stress-absorbing layer 22 at a region where the opposite electrode 20 overlaps the wall 12, but the configuration is not limited thereto. For example, the opposite electrode 20 may be covered by the stress-absorbing layer 22 only at part of a region where the opposite electrode 20 overlaps the wall 12. In other words, any configuration can be employed, as long as the opposite electrode 20 is covered by the stress-absorbing layer 22 at at least part of the region where the opposite electrode 20 overlaps the wall 12.

(5) Modification 5

In the light-emitting device D10 according to the eleventh embodiment, the opposite electrode 20 is completely covered by the stress-absorbing layer 22 at a region that corresponds to the zone of each light-emitting element U, but the configuration is not limited thereto. For example, the opposite electrode 20 may not be covered by the stress-absorbing layer 22 at a region that corresponds to the central area of the zone of each light-emitting element U. In other words, any configuration can be employed, as long as the opposite electrode 20 is covered by the stress-absorbing layer 22 at at least part of the region that corresponds to the zone of each light-emitting element U, but the auxiliary electrode 40 is not covered by the stress-absorbing layer 22.

In the configuration in which the opposite electrode 20 is not covered by the stress-absorbing layer 22 at part of the region corresponding to the zone of each light-emitting element U, as in the light-emitting device D9 according to the tenth embodiment, there is an advantage that the amount of light emitted from the light-emitting device toward the observer side can be ensured compared to that in comparative example 1. That is, if a region where stress is concentrated can be determined in advance, it is preferred to selectively form a stress-absorbing layer 22 at the stress-concentrating region. The stress-concentrating region corresponds to the region where unevenness due to the wall 12 is formed. In particular, when the shape of each light-emitting element U is a rectangle, stress is concentrated at each corner of the light-emitting element.

M: Applications

Figure 35:
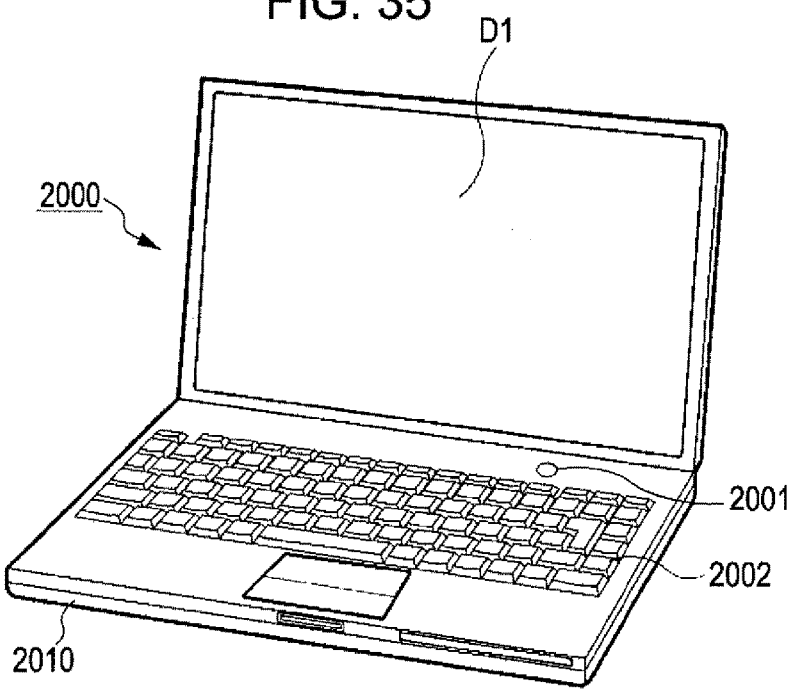
FIG. 35 is a perspective view illustrating a configuration of a mobile personal computer including the light-emitting device according to the first embodiment as a display.

Electronic equipment utilizing the light-emitting device according to the invention will now be described. FIG. 35 is a perspective view illustrating a configuration of a mobile personal computer whose display is the light-emitting device D1 according to the first embodiment. The personal computer 2000 includes a display of the light-emitting device D1 and a body 2010. The body 2010 is provided with a power switch 2001 and a keyboard 2002. Since the light-emitting device D1 employs OLED elements having both high electrical conductivity and high transparency, a high quality image can be displayed. Furthermore, the display in the configuration shown in FIG. 35 may be any of the light-emitting devices (D2 to D10) according to the other embodiments.

Figure 36:
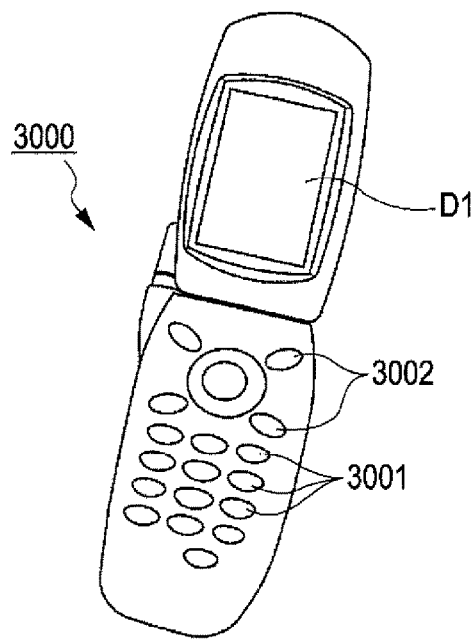
FIG. 36 is a diagram illustrating a configuration of a mobile phone to which the light-emitting device according to the first embodiment is applied.

FIG. 36 shows a configuration of a mobile phone to which the light-emitting device D1 according to the first embodiment is applied. The mobile phone 3000 includes a plurality of operation buttons 3001, a scroll button 3002, and a display of the light-emitting device D1. The image displayed on the light-emitting device D1 is scrolled by operating the scroll button 3002. Furthermore, the display in the configuration shown in FIG. 36 may be any of the light-emitting devices (D2 to D10) according to the other embodiments.

Figure 37:
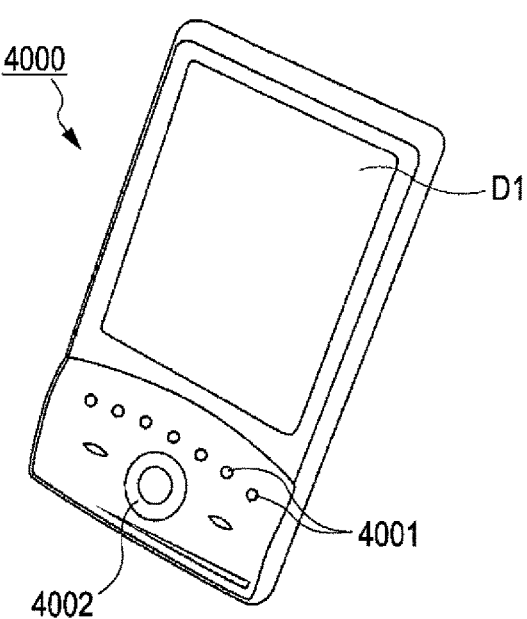
FIG. 37 is a diagram illustrating a configuration of a handheld terminal to which the light-emitting device according to the first embodiment is applied.

FIG. 37 shows a configuration of a handheld terminal (PDA: personal digital assistant) to which the light-emitting device D1 according to the first embodiment is applied. The handheld terminal 4000 includes a plurality of operation buttons 4001, a power switch 4002, and a display of the light-emitting device D1. Various types of information, such as addresses and schedules, are displayed on the light-emitting device D1 by operating the power switch 4002. Furthermore, the display in the configuration shown in FIG. 37 may be any of the light-emitting devices (D2 to D10) according to the other embodiments.

Examples of the electronic equipment to which the light-emitting device according to the invention is applied include, in addition to those shown in FIGS. 35 to 37, a digital still camera, a TV set, a video camera, a car navigation system, a pager, an electronic notebook, electronic paper, a calculator, a word processor, a workstation, a videophone, a POS terminal, a printer, a scanner, a photocopier, a video player, and equipment having a touch panel.

What is claimed is:

1. A method for manufacturing a light-emitting device, the method comprising:
   forming a light-reflecting layer disposed above a substrate;

forming a first electrode disposed on or above the light-reflecting layer;

forming a light-emitting function layer disposed on or above the first electrode;

forming an electron-injection layer disposed on the light-emitting function layer; and forming a second electrode on the electron-injection layer, wherein the forming the second electrode is performed by co-depositing Mg and Ag at a deposition rate ratio of Mg to Ag in the range of 1:20 to 1:50.

2. A method for manufacturing a light-emitting device according to claim 1, wherein the second electrode has a thickness in a range 10 nm to 30 nm.

3. A method for manufacturing a light-emitting device according to claim 1, wherein the electron-injection layer is made of LiF.

* * * * *